US009802456B2

(12) United States Patent
Hall et al.

(10) Patent No.: US 9,802,456 B2
(45) Date of Patent: Oct. 31, 2017

(54) DAMPER WITH INTEGRATED ELECTRONICS

(71) Applicant: Tenneco Automotive Operating Company Inc., Lake Forest, IL (US)

(72) Inventors: Douglas Hall, Columbus, MI (US); Matthew L. Roessle, Temperance, MI (US); Rick J. Simpson, La Salle, MI (US); Scott S. Dunaway, Carleton, MI (US); Zachary Lopez, Monroe, MI (US)

(73) Assignee: Tenneco Automotive Operating Company Inc., Lake Forest, IL (US)

( * ) Notice: Subject to any disclaimer, the term of this patent is extended or adjusted under 35 U.S.C. 154(b) by 121 days.

(21) Appl. No.: 14/303,943

(22) Filed: Jun. 13, 2014

(65) Prior Publication Data
US 2015/0247544 A1 Sep. 3, 2015
US 2017/0276206 A9 Sep. 28, 2017

Related U.S. Application Data

(63) Continuation-in-part of application No. 14/193,879, filed on Feb. 28, 2014, now Pat. No. 9,399,383.
(Continued)

(51) Int. Cl.
*F16F 9/34* (2006.01)
*B60G 17/08* (2006.01)
(Continued)

(52) U.S. Cl.
CPC ............ *B60G 17/08* (2013.01); *B60G 13/00* (2013.01); *B60G 17/015* (2013.01);
(Continued)

(58) Field of Classification Search
CPC .......... F16F 9/463; F16F 9/464; F16F 9/3207; F16F 9/3292; F16F 9/3242; B60G 17/015;
(Continued)

(56) References Cited

U.S. PATENT DOCUMENTS 2,409,349 A  10/1946  Focht
2,473,043 A   6/1949  Whisler, Jr.
(Continued)

FOREIGN PATENT DOCUMENTS

CN  1094855 C  11/2002
CN  1267611 C   8/2006
(Continued)

OTHER PUBLICATIONS

Search Report and Written Opinion dated Jun. 20, 2014 in corresponding PCT Application No. PCT/US2014/019534 (12 pages).
(Continued)

*Primary Examiner* — Pamela Rodriguez
(74) *Attorney, Agent, or Firm* — Harness, Dickey & Pierce, P.L.C.

(57) ABSTRACT

A bumper cap assembly for an electrically adjustable hydraulic shock absorber. The bumper cap assembly includes a printed circuit board assembly and a bumper cap. The printed circuit board assembly includes power drive electronics and is electrically coupled to the shock absorber. The bumper cap defined a gap, wherein the printed circuit board assembly is housed within the gap.

8 Claims, 13 Drawing Sheets

Related U.S. Application Data

(60) Provisional application No. 61/770,426, filed on Feb. 28, 2013.

(51) Int. Cl.
| | |
|---|---|
| *B60G 13/00* | (2006.01) |
| *B60G 17/015* | (2006.01) |
| *B60G 17/019* | (2006.01) |
| *F16F 9/32* | (2006.01) |
| *F16F 9/46* | (2006.01) |
| *H05K 7/02* | (2006.01) |

(52) U.S. Cl.
CPC ... *B60G 17/0152* (2013.01); *B60G 17/01908* (2013.01); *F16F 9/3207* (2013.01); *F16F 9/3242* (2013.01); *F16F 9/3292* (2013.01); *F16F 9/463* (2013.01); *F16F 9/464* (2013.01); *H05K 7/02* (2013.01); *B60G 2202/24* (2013.01); *B60G 2204/112* (2013.01); *B60G 2401/17* (2013.01); *B60G 2500/10* (2013.01); *B60G 2500/114* (2013.01); *B60G 2600/182* (2013.01); *B60G 2600/71* (2013.01); *B60G 2800/162* (2013.01)

(58) Field of Classification Search
CPC .... B60G 17/0152; B60G 17/08; B60G 13/00; B60G 17/01908; B60G 17/018; B60G 2202/24; B60G 2204/112; B60G 2401/17; B60G 2500/114; B60G 2600/182; B60G 2600/71; B60G 2800/162; B60G 2500/10; H05K 7/02
USPC .......... 188/299.1, 266.1–266.7, 282.2–282.4
See application file for complete search history.

(56) References Cited

U.S. PATENT DOCUMENTS

| | | |
|---|---|---|
| 3,896,908 A | 7/1975 | Petrak |
| 3,945,474 A | 3/1976 | Palmer |
| 4,317,105 A | 2/1982 | Sinha et al. |
| 4,352,417 A | 10/1982 | Stinson |
| 4,468,050 A | 8/1984 | Woods et al. |
| 4,552,324 A | 11/1985 | Hrusch |
| 4,564,214 A | 1/1986 | Tokunaga et al. |
| 4,589,528 A | 5/1986 | Axthammer et al. |
| 4,591,186 A | 5/1986 | Ashiba |
| 4,696,489 A | 9/1987 | Fujishiro et al. |
| 4,723,640 A | 2/1988 | Beck |
| 4,726,453 A | 2/1988 | Obstfelder et al. |
| 4,749,070 A | 6/1988 | Moser et al. |
| 4,776,437 A | 10/1988 | Ishibashi et al. |
| 4,788,489 A | 11/1988 | Kobayashi et al. |
| 4,846,317 A | 7/1989 | Hudgens |
| 4,850,460 A | 7/1989 | Knecht et al. |
| 4,867,476 A | 9/1989 | Yamanaka et al. |
| 4,872,537 A | 10/1989 | Warner |
| 4,892,328 A | 1/1990 | Kurtzman et al. |
| 4,909,536 A | 3/1990 | Hale |
| 4,913,457 A | 4/1990 | Hafner et al. |
| 4,943,083 A | 7/1990 | Groves et al. |
| 4,958,706 A | 9/1990 | Richardson et al. |
| 4,969,662 A | 11/1990 | Stuart |
| 4,973,854 A | 11/1990 | Hummel |
| 4,984,819 A | 1/1991 | Kakizaki et al. |
| 4,986,393 A | 1/1991 | Preukschat et al. |
| 4,988,967 A | 1/1991 | Miller et al. |
| 5,038,613 A | 8/1991 | Takenaka et al. |
| 5,058,715 A | 10/1991 | Silberstein |
| 5,067,743 A | 11/1991 | Kokubo et al. |
| 5,092,626 A | 3/1992 | Athanas et al. |
| 5,106,053 A | 4/1992 | Miller et al. |
| 5,123,671 A | 6/1992 | Driessen et al. |
| 5,133,434 A | 7/1992 | Kikushima et al. |
| 5,133,574 A | 7/1992 | Yamaoka et al. |
| 5,143,185 A | 9/1992 | Klein et al. |
| 5,154,442 A | 10/1992 | Milliken |
| 5,160,162 A | 11/1992 | Mouri et al. |
| 5,189,614 A | 2/1993 | Mitsuoka et al. |
| 5,200,895 A | 4/1993 | Emura et al. |
| 5,242,190 A | 9/1993 | Morris |
| 5,285,878 A | 2/1994 | Scheffel et al. |
| 5,293,968 A | 3/1994 | Schuelke et al. |
| 5,299,488 A | 4/1994 | Kadlicko et al. |
| 5,337,863 A | 8/1994 | Lizell |
| 5,350,187 A | 9/1994 | Shinozaki |
| 5,350,983 A | 9/1994 | Miller et al. |
| 5,360,089 A | 11/1994 | Nakamura et al. |
| 5,360,230 A | 11/1994 | Yamada et al. |
| 5,363,945 A | 11/1994 | Lizell et al. |
| 5,383,679 A | 1/1995 | Nakamura et al. |
| 5,390,121 A | 2/1995 | Wolfe |
| 5,396,973 A | 3/1995 | Schwemmer et al. |
| 5,404,973 A | 4/1995 | Katoh et al. |
| 5,430,648 A | 7/1995 | Sasaki |
| 5,435,421 A | 7/1995 | Beck |
| 5,439,085 A | 8/1995 | Woessner |
| 5,485,417 A | 1/1996 | Wolf et al. |
| 5,487,455 A | 1/1996 | Feigel |
| 5,488,556 A | 1/1996 | Sasaki |
| 5,497,325 A | 3/1996 | Mine |
| 5,497,862 A | 3/1996 | Hoya |
| 5,532,921 A | 7/1996 | Katsuda |
| 5,570,762 A | 11/1996 | Jentsch et al. |
| 5,577,579 A | 11/1996 | Derr |
| 5,590,898 A | 1/1997 | Williams et al. |
| 5,597,054 A | 1/1997 | Nagai et al. |
| 5,632,503 A | 5/1997 | Raad et al. |
| 5,638,275 A | 6/1997 | Sasaki et al. |
| 5,653,315 A | 8/1997 | Ekquist et al. |
| 5,655,633 A | 8/1997 | Nakadate et al. |
| 5,656,315 A | 8/1997 | Tucker et al. |
| 5,657,840 A | 8/1997 | Lizell |
| 5,690,195 A | 11/1997 | Kruckemeyer et al. |
| 5,725,239 A | 3/1998 | de Molina |
| 5,775,470 A | 7/1998 | Feigel |
| 5,803,482 A | 9/1998 | Kim |
| 5,833,036 A | 11/1998 | Gillespie |
| 5,845,672 A | 12/1998 | Reuter et al. |
| 5,860,497 A | 1/1999 | Takahashi |
| 5,878,851 A | 3/1999 | Carlson et al. |
| 5,890,081 A | 3/1999 | Sasaki |
| 5,913,391 A | 6/1999 | Jeffries et al. |
| 5,934,421 A | 8/1999 | Nakadate et al. |
| 5,937,976 A | 8/1999 | Grundei |
| 5,950,775 A | 9/1999 | Achmad |
| 5,967,268 A | 10/1999 | de Molina et al. |
| 5,987,369 A | 11/1999 | Kwak et al. |
| 6,003,644 A | 12/1999 | Tanaka |
| 6,036,500 A | 3/2000 | Francis et al. |
| 6,092,011 A | 7/2000 | Hiramoto |
| 6,095,489 A | 8/2000 | Kaneko et al. |
| 6,105,740 A | 8/2000 | Marzocchi et al. |
| 6,109,400 A | 8/2000 | Ayyildiz et al. |
| 6,135,250 A | 10/2000 | Forster et al. |
| 6,155,391 A | 12/2000 | Kashiwagi et al. |
| 6,213,262 B1 | 4/2001 | Bell |
| 6,273,224 B1 | 8/2001 | Achmad |
| 6,296,091 B1 | 10/2001 | Hamilton |
| 6,298,958 B1 | 10/2001 | Hwang |
| 6,302,248 B1 | 10/2001 | Nakadate |
| 6,321,888 B1 | 11/2001 | Reybrouck et al. |
| 6,343,677 B2 | 2/2002 | Bell |
| 6,427,986 B1 | 8/2002 | Sakai et al. |
| 6,460,664 B1 | 10/2002 | Steed et al. |
| 6,464,053 B1 | 10/2002 | Hoebrechts |
| 6,496,761 B1 | 12/2002 | Ulyanov et al. |
| 6,533,294 B1 | 3/2003 | Germain et al. |
| 6,588,726 B2 | 7/2003 | Osterhart et al. |
| 6,616,124 B2 | 9/2003 | Oliver et al. |
| 6,651,787 B2 | 11/2003 | Grundei |
| 6,655,512 B2 | 12/2003 | Moradmand et al. |

(56) References Cited

U.S. PATENT DOCUMENTS

| | | |
|---|---|---|
| 6,672,436 B1 | 1/2004 | Keil et al. |
| 6,707,290 B2 | 3/2004 | Nyce et al. |
| 6,708,803 B2 | 3/2004 | Jensen |
| 6,782,980 B2 | 8/2004 | Nakadate |
| 6,814,193 B2 | 11/2004 | Grundei |
| 6,851,528 B2 | 2/2005 | Lemieux |
| 6,879,898 B2 | 4/2005 | Ghoneim et al. |
| 6,904,344 B2 | 6/2005 | LaPlante et al. |
| 6,959,797 B2 | 11/2005 | Mintgen et al. |
| 6,964,325 B2 | 11/2005 | Maes |
| 6,978,872 B2 | 12/2005 | Turner |
| 7,032,912 B2 | 4/2006 | Nicot et al. |
| 7,168,709 B2 | 1/2007 | Niwa et al. |
| 7,214,103 B2 | 5/2007 | Kim et al. |
| 7,234,574 B2 | 6/2007 | Matsunaga et al. |
| 7,234,707 B2 | 6/2007 | Green et al. |
| 7,273,138 B2 | 9/2007 | Park |
| 7,286,919 B2 | 10/2007 | Nordgren et al. |
| 7,318,595 B2 | 1/2008 | Lamela et al. |
| 7,347,307 B2 | 3/2008 | Joly |
| 7,374,028 B2 | 5/2008 | Fox |
| 7,389,994 B2 | 6/2008 | Trudeau et al. |
| 7,413,062 B2 | 8/2008 | Vandewal |
| 7,416,189 B2 | 8/2008 | Wilde et al. |
| 7,475,538 B2 | 1/2009 | Bishop |
| 7,493,995 B2 | 2/2009 | Sas et al. |
| 7,604,101 B2 | 10/2009 | Park |
| 7,611,000 B2 | 11/2009 | Naito |
| 7,621,538 B2 | 11/2009 | Nordmeyer et al. |
| 7,628,253 B2 | 12/2009 | Jin et al. |
| 7,644,933 B2 | 1/2010 | Brookes et al. |
| 7,654,369 B2 | 2/2010 | Murray et al. |
| 7,654,370 B2 | 2/2010 | Cubalchini, Jr. |
| 7,680,573 B2 | 3/2010 | Ogawa |
| 7,722,405 B2 | 5/2010 | Jaklin et al. |
| 7,743,896 B2 | 6/2010 | Vanhees et al. |
| 7,770,983 B2 | 8/2010 | Park |
| 7,775,333 B2 | 8/2010 | Or et al. |
| 7,849,983 B2 | 12/2010 | St. Clair et al. |
| 7,878,311 B2 | 2/2011 | Van Weelden et al. |
| 7,896,311 B2 | 3/2011 | Jee |
| 7,912,603 B2 | 3/2011 | Stiller et al. |
| 7,926,513 B2 | 4/2011 | Ishibashi et al. |
| 7,931,282 B2 | 4/2011 | Kolp et al. |
| 7,942,248 B2 | 5/2011 | St. Clair et al. |
| 7,946,163 B2 | 5/2011 | Gartner |
| 7,946,399 B2 | 5/2011 | Masamura |
| 7,967,116 B2 | 6/2011 | Boerschig |
| 7,967,117 B2 | 6/2011 | Abe |
| 7,992,692 B2 | 8/2011 | Lee et al. |
| 7,997,394 B2 | 8/2011 | Yamaguchi |
| 8,056,392 B2 | 11/2011 | Ryan et al. |
| 8,075,002 B1 | 12/2011 | Pionke et al. |
| 8,113,521 B2 | 2/2012 | Lin et al. |
| 8,116,939 B2 | 2/2012 | Kajino et al. |
| 8,132,654 B2 | 3/2012 | Widla et al. |
| 8,136,644 B2 | 3/2012 | Sonsterod |
| 8,160,774 B2 | 4/2012 | Li et al. |
| 8,214,106 B2 | 7/2012 | Ghoneim et al. |
| 8,267,382 B2 | 9/2012 | Yazaki et al. |
| 8,275,515 B2 | 9/2012 | Wright et al. |
| 8,317,172 B2 | 11/2012 | Quinn et al. |
| 8,393,446 B2 | 3/2013 | Haugen |
| 8,430,217 B2 | 4/2013 | Hennecke et al. |
| 8,525,453 B2 | 9/2013 | Ogawa |
| 8,567,575 B2 | 10/2013 | Jung et al. |
| 8,616,351 B2 | 12/2013 | Roessle et al. |
| 8,666,596 B2 | 3/2014 | Arenz |
| 8,684,367 B2 | 4/2014 | Haugen |
| 8,695,766 B2 | 4/2014 | Yamashita et al. |
| 8,794,405 B2 | 8/2014 | Yamashita et al. |
| 8,844,687 B2 | 9/2014 | Yu et al. |
| 8,899,391 B2 | 12/2014 | Yamasaki et al. |
| 8,948,941 B2 | 2/2015 | Ogawa |
| 9,027,937 B2 | 5/2015 | Ryan et al. |
| 9,150,077 B2 | 10/2015 | Roessle et al. |
| 9,163,691 B2 | 10/2015 | Roessle et al. |
| 9,188,186 B2 | 11/2015 | Hoven et al. |
| 9,217,483 B2 | 12/2015 | Dunaway et al. |
| 9,399,383 B2 | 7/2016 | Blankenship et al. |
| 2002/0133277 A1 | 9/2002 | Koh |
| 2003/0164193 A1 | 9/2003 | Lou |
| 2003/0192755 A1 | 10/2003 | Barbison et al. |
| 2004/0090020 A1 | 5/2004 | Braswell |
| 2004/0154887 A1 | 8/2004 | Nehl et al. |
| 2004/0199313 A1 | 10/2004 | Dellinger |
| 2005/0001472 A1 | 1/2005 | Bale et al. |
| 2005/0029063 A1 | 2/2005 | Neumann |
| 2005/0056502 A1 | 3/2005 | Maes |
| 2005/0056504 A1 | 3/2005 | Holiviers |
| 2005/0061593 A1 | 3/2005 | DeGronckel et al. |
| 2005/0085969 A1 | 4/2005 | Kim |
| 2005/0113997 A1 | 5/2005 | Kim |
| 2005/0173849 A1 | 8/2005 | Vandewal |
| 2006/0038149 A1 | 2/2006 | Albert et al. |
| 2006/0124415 A1 | 6/2006 | Joly |
| 2006/0219503 A1 | 10/2006 | Kim |
| 2007/0034466 A1 | 2/2007 | Paesmans et al. |
| 2007/0051574 A1 | 3/2007 | Keil et al. |
| 2007/0255466 A1 | 11/2007 | Chiao |
| 2008/0054537 A1 | 3/2008 | Harrison |
| 2008/0243336 A1 | 10/2008 | Fitzgibbons |
| 2008/0250844 A1 | 10/2008 | Gartner |
| 2008/0264743 A1 | 10/2008 | Lee et al. |
| 2008/0277218 A1 | 11/2008 | Fox |
| 2009/0071772 A1 | 3/2009 | Cho et al. |
| 2009/0078517 A1 | 3/2009 | Maneyama et al. |
| 2009/0084647 A1 | 4/2009 | Maneyama et al. |
| 2009/0132122 A1 | 5/2009 | Kim et al. |
| 2009/0192673 A1 | 7/2009 | Song et al. |
| 2009/0200125 A1 | 8/2009 | Sonsterod |
| 2009/0200503 A1 | 8/2009 | Park |
| 2010/0001217 A1 | 1/2010 | Jee et al. |
| 2010/0044172 A1 | 2/2010 | Jee et al. |
| 2010/0066051 A1 | 3/2010 | Haugen |
| 2010/0109276 A1 | 5/2010 | Marjoram et al. |
| 2010/0138116 A1 | 6/2010 | Coombs |
| 2010/0163354 A1 | 7/2010 | Braun |
| 2010/0181154 A1 | 7/2010 | Panichgasem |
| 2010/0191420 A1 | 7/2010 | Honma et al. |
| 2010/0211253 A1 | 8/2010 | Morais Dos Santos et al. |
| 2010/0276906 A1 | 11/2010 | Galasso et al. |
| 2010/0301578 A1 | 12/2010 | Noda et al. |
| 2010/0326267 A1 | 12/2010 | Hata |
| 2011/0035091 A1 | 2/2011 | Yamamoto |
| 2011/0056780 A1 | 3/2011 | St.Clair et al. |
| 2011/0056783 A1 | 3/2011 | Teraoka et al. |
| 2011/0079475 A1 | 4/2011 | Roessle et al. |
| 2011/0101579 A1 | 5/2011 | Polakowski et al. |
| 2011/0153157 A1 | 6/2011 | Klank et al. |
| 2011/0198172 A1 | 8/2011 | Whan |
| 2011/0214956 A1 | 9/2011 | Marking |
| 2011/0240424 A1 | 10/2011 | Beck |
| 2011/0298399 A1 | 12/2011 | Ogawa et al. |
| 2012/0018263 A1 | 1/2012 | Marking |
| 2012/0048665 A1 | 3/2012 | Marking |
| 2012/0073918 A1 | 3/2012 | Nishimura et al. |
| 2012/0073920 A1 | 3/2012 | Yamasaki et al. |
| 2012/0181126 A1 | 7/2012 | de Kock |
| 2012/0186922 A1 | 7/2012 | Battlogg et al. |
| 2012/0228072 A1 | 9/2012 | Mangelschots et al. |
| 2012/0305349 A1 | 12/2012 | Murakami et al. |
| 2013/0081913 A1 | 4/2013 | Nowaczyk et al. |
| 2013/0090808 A1 | 4/2013 | Lemme et al. |
| 2013/0228401 A1 | 9/2013 | Bender et al. |
| 2013/0234379 A1 | 9/2013 | Panichgasem |
| 2013/0263943 A1 | 10/2013 | Forster |
| 2013/0275003 A1 | 10/2013 | Uchino et al. |
| 2013/0299291 A1 | 11/2013 | Ewers et al. |
| 2013/0313057 A1 | 11/2013 | Tsukahara et al. |
| 2013/0328277 A1 | 12/2013 | Ryan et al. |
| 2013/0340865 A1 | 12/2013 | Manger et al. |
| 2013/0341140 A1 | 12/2013 | Nakajima |
| 2013/0341842 A1 | 12/2013 | Weber |

(56) References Cited

U.S. PATENT DOCUMENTS

| | | |
|---|---|---|
| 2013/0345933 A1 | 12/2013 | Norton et al. |
| 2014/0102842 A1 | 4/2014 | Roessle et al. |
| 2014/0125018 A1 | 5/2014 | Brady et al. |
| 2014/0202808 A1 | 7/2014 | Spyche, Jr. et al. |
| 2014/0216871 A1 | 8/2014 | Shibahara |
| 2014/0231200 A1 | 8/2014 | Katayama |
| 2014/0238797 A1* | 8/2014 | Blankenship ...... B60G 17/0152 188/314 |
| 2014/0239602 A1 | 8/2014 | Blankenship et al. |
| 2014/0244112 A1 | 8/2014 | Dunaway et al. |
| 2014/0260233 A1 | 9/2014 | Giovanardi et al. |
| 2014/0262648 A1 | 9/2014 | Roessle et al. |
| 2014/0262652 A1 | 9/2014 | Roessle et al. |
| 2014/0262654 A1 | 9/2014 | Roessle et al. |
| 2014/0265169 A1 | 9/2014 | Giovanardi et al. |
| 2014/0265170 A1 | 9/2014 | Giovanardi et al. |
| 2014/0284156 A1 | 9/2014 | Kim |
| 2014/0291090 A1 | 10/2014 | Shimasaki |
| 2014/0297116 A1 | 10/2014 | Anderson et al. |
| 2014/0297117 A1 | 10/2014 | Near et al. |
| 2014/0303844 A1 | 10/2014 | Hoffmann et al. |
| 2015/0088379 A1 | 3/2015 | Hirao |

FOREIGN PATENT DOCUMENTS

| | | |
|---|---|---|
| CN | 101025213 A | 8/2007 |
| CN | 100381728 C | 4/2008 |
| CN | 101229765 A | 7/2008 |
| CN | 101509535 A | 8/2009 |
| CN | 201575099 U | 9/2010 |
| CN | 201575100 U | 9/2010 |
| CN | 101857035 A | 10/2010 |
| CN | 201636258 U | 11/2010 |
| CN | 201705852 U | 1/2011 |
| CN | 102032306 A | 4/2011 |
| CN | 102076988 A | 5/2011 |
| CN | 102109024 A | 6/2011 |
| CN | 102345700 A | 2/2012 |
| CN | 103154562 A | 6/2013 |
| CN | 103168183 A | 6/2013 |
| CN | 103244495 A | 8/2013 |
| CN | 203186023 U | 9/2013 |
| CN | 103429929 A | 12/2013 |
| CN | 103702888 A | 4/2014 |
| CN | 203548687 U | 4/2014 |
| CN | 103946095 A | 7/2014 |
| CN | 104074909 A | 10/2014 |
| DE | 3406875 A1 | 9/1985 |
| DE | 3518858 A1 | 11/1985 |
| DE | 3432465 A1 | 3/1986 |
| DE | 3518327 A1 | 11/1986 |
| DE | 3928343 A1 | 2/1991 |
| DE | 4041619 A1 | 6/1992 |
| DE | 19853277 C1 | 5/2000 |
| DE | 10025399 A1 | 12/2000 |
| DE | 10238657 A1 | 3/2004 |
| DE | 112007002377 T5 | 8/2009 |
| DE | WO-2010029133 A1 * | 3/2010 |
| EP | 1588072 A1 | 10/2005 |
| EP | 1746302 A1 | 1/2007 |
| EP | 2105330 A1 | 9/2009 |
| GB | 2123922 A | 2/1984 |
| GB | 2154700 A | 9/1985 |
| JP | 61125907 | 6/1986 |
| JP | 62-253506 | 11/1987 |
| JP | S6467408 A | 3/1989 |
| JP | 06-026546 | 2/1994 |
| JP | 07-113434 | 5/1995 |
| JP | 7056311 | 6/1995 |
| JP | 08-260747 | 10/1996 |
| JP | 09-217779 | 8/1997 |
| JP | 2002-349630 A | 12/2002 |
| WO | 9218788 A1 | 10/1992 |
| WO | WO-9218788 A1 | 10/1992 |

OTHER PUBLICATIONS

Office Action from German Patent Office for corresponding German Application No. 11 2010 003 954.2 dated Dec. 9, 2015, 19 pages.

* cited by examiner

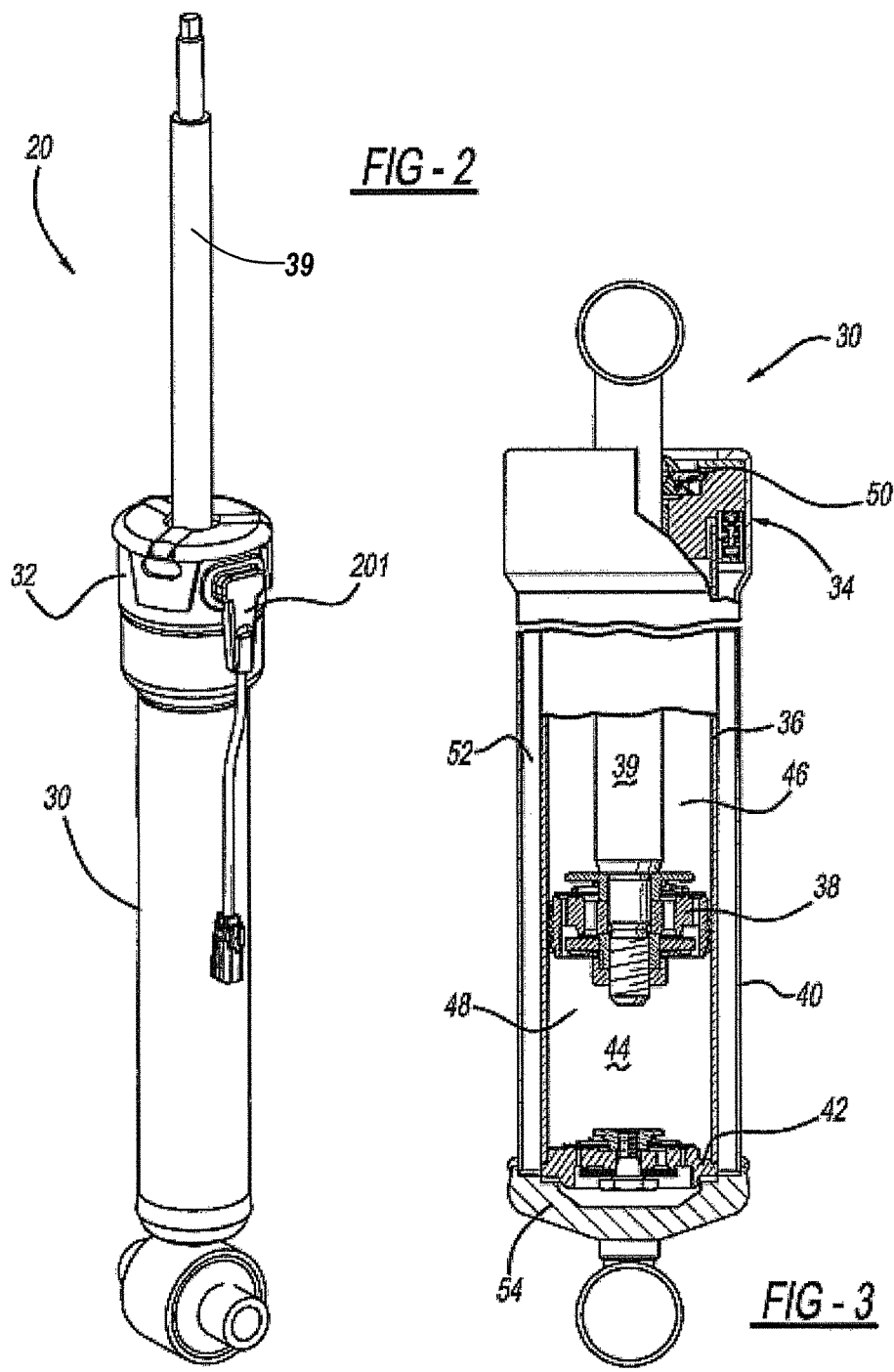

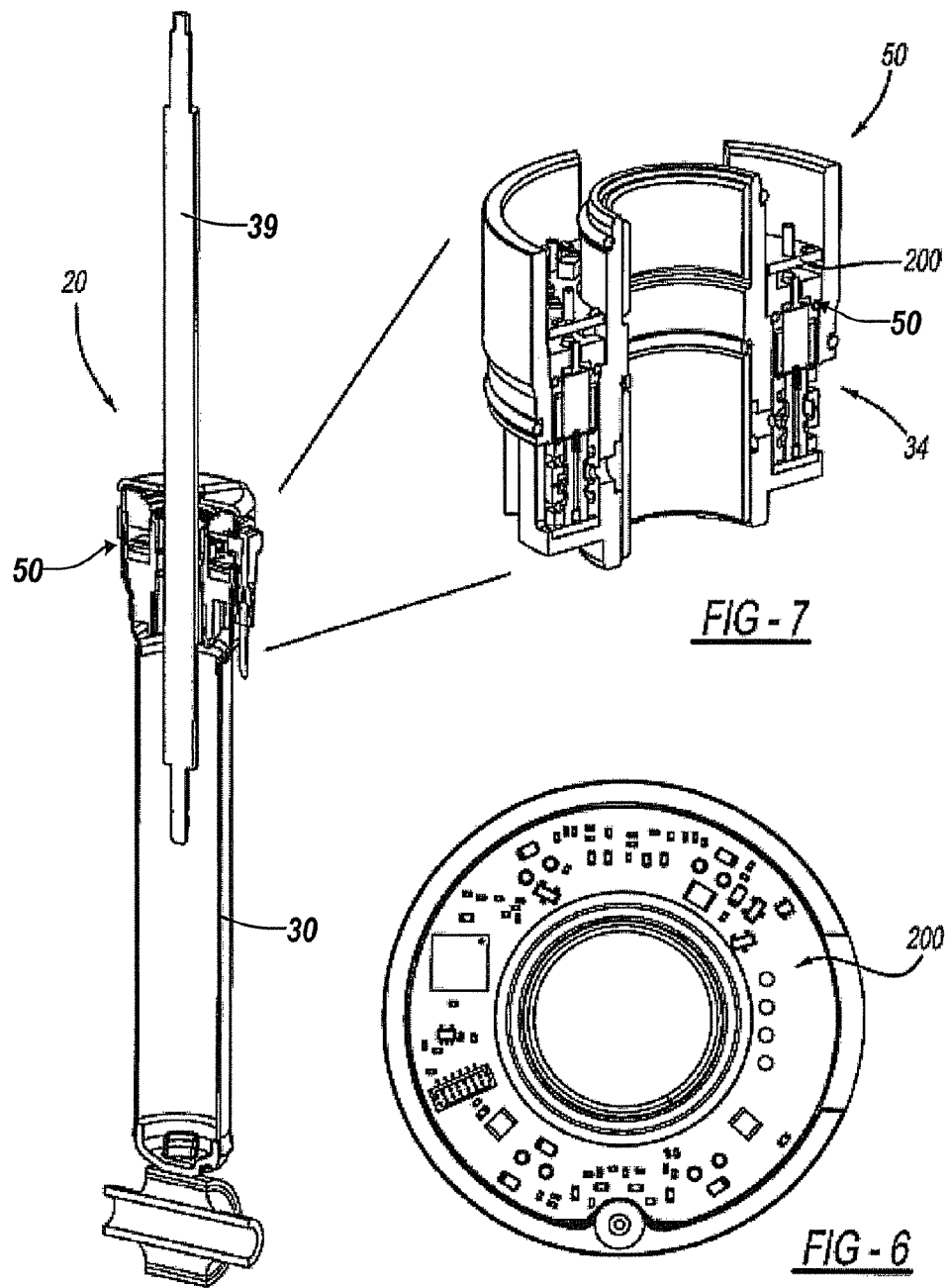

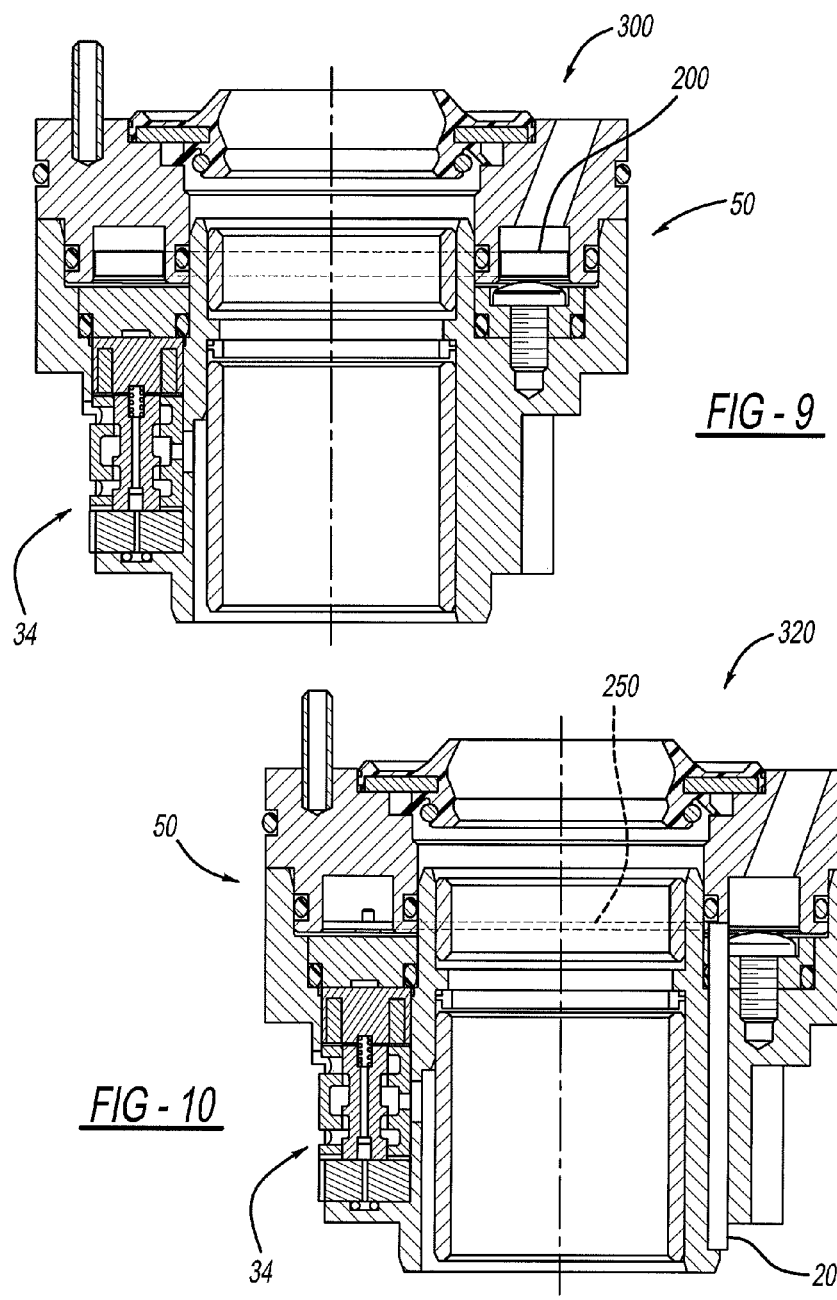

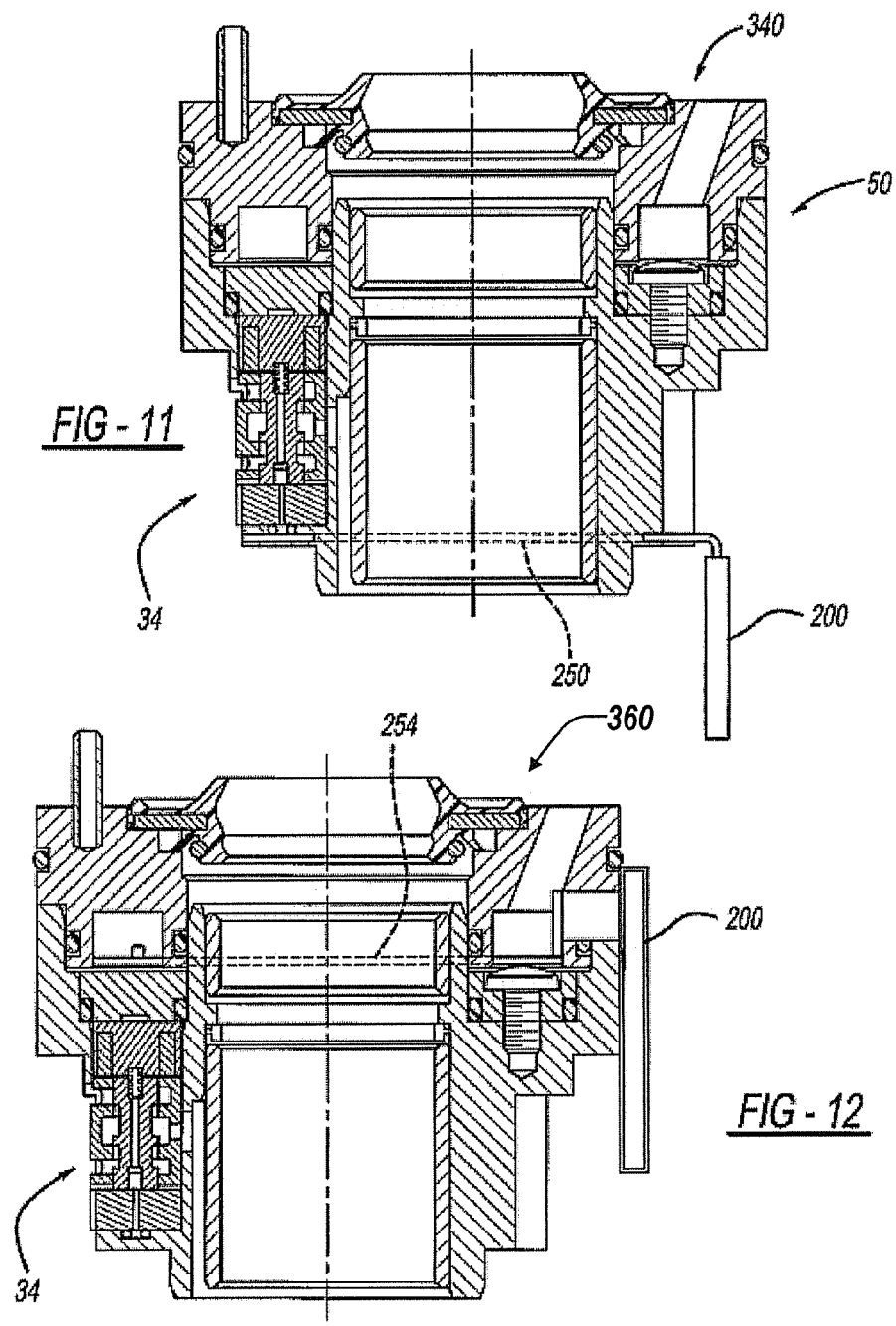

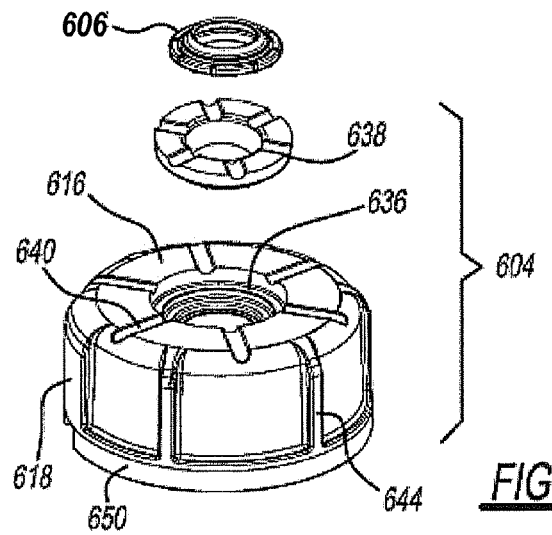
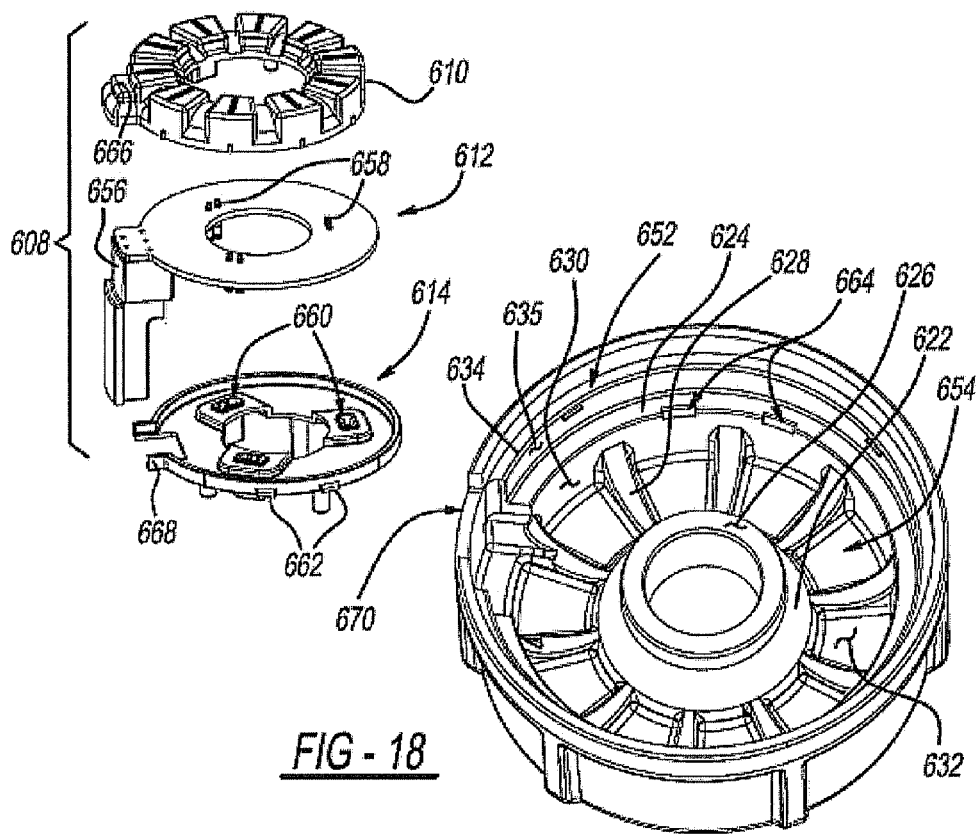

US 9,802,456 B2

DAMPER WITH INTEGRATED ELECTRONICS

CROSS-REFERENCE TO RELATED APPLICATIONS

This application is a continuation-in-part of U.S. patent application Ser. No. 14/193,879 filed on Feb. 28, 2014, which claims the benefit of U.S. Provisional Application No. 61/770,426, filed on Feb. 28, 2013. The entire disclosures of the above applications are incorporated herein by reference.

FIELD

The present disclosure relates to a hydraulic damper or shock absorber for use in a suspension system of a vehicle. More particularly, to a damper having an integrated electronic system.

BACKGROUND

This section provides background information related to the present disclosure which is not necessarily prior art.

Shock absorbers are used in conjunction with automotive suspension systems to absorb unwanted vibrations which occur during driving. To absorb the unwanted vibrations, shock absorbers are generally connected between the sprung portion (body) and the unsprung portion (suspension) of the automobile.

In recent years, vehicles may be equipped with an electrically adjustable damping system that includes an electrically adjustable hydraulic shock absorber. Such adjustable shock absorbers may include an electromechanical valve/actuator disposed therein. A main control unit disposed within the vehicle is used to control the damping state of each of the adjustable shock absorber by controlling the actuation of the electromechanical valve.

SUMMARY

This section provides a general summary of the disclosure, and is not a comprehensive disclosure of its full scope or all of its features.

The present disclosure relates to a damper system for a vehicle. The damper system includes an electrically adjustable hydraulic shock absorber, and a bumper cap assembly that is coupled to an end of the shock absorber. The bumper cap assembly includes an electronic isolator assembly and a bumper cap. The electronic isolator assembly is disposed between the shock absorber and the bumper cap.

In an aspect of the present disclosure, the bumper cap assembly is a load bearing component that protects the shock absorber. The bumper cap houses the electronic isolator assembly, which includes power drive electronics for controlling the shock absorber. The bumper cap assembly has multiple seals which protect the electronic isolator assembly from the environment. The bumper cap has structural features that minimize deflection and transfer energy to the shock absorber, thereby protecting the electronic isolator assembly within.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2 is a perspective view of an example of the damper system;

FIG. 3 is a partial cross-sectional view of the shock absorber of the damper system;

FIG. 6 illustrates a printed circuit board assembly (PCBA) disposed within the shock absorber;

FIG. 7 is a cross-sectional view of the damper system with an enlarged view of a rod guide assembly having the PCBA;

FIG. 9 illustrates an internal annular arrangement of the PCBA;

FIG. 10 illustrates an internal vertical arrangement of the PCBA;

FIG. 11 illustrates an inverted-wet arrangement of the PCBA;

FIG. 12 illustrates an external arrangement of the PCBA;

FIG. 17 is an exploded view of the bumper cap assembly of FIG. 15;

FIGS. 18 and 19 are perspective views of a bumper cap of the bumper cap assembly;

Corresponding reference numerals indicate corresponding parts throughout the several views of the drawings.

DETAILED DESCRIPTION

Figure 1:
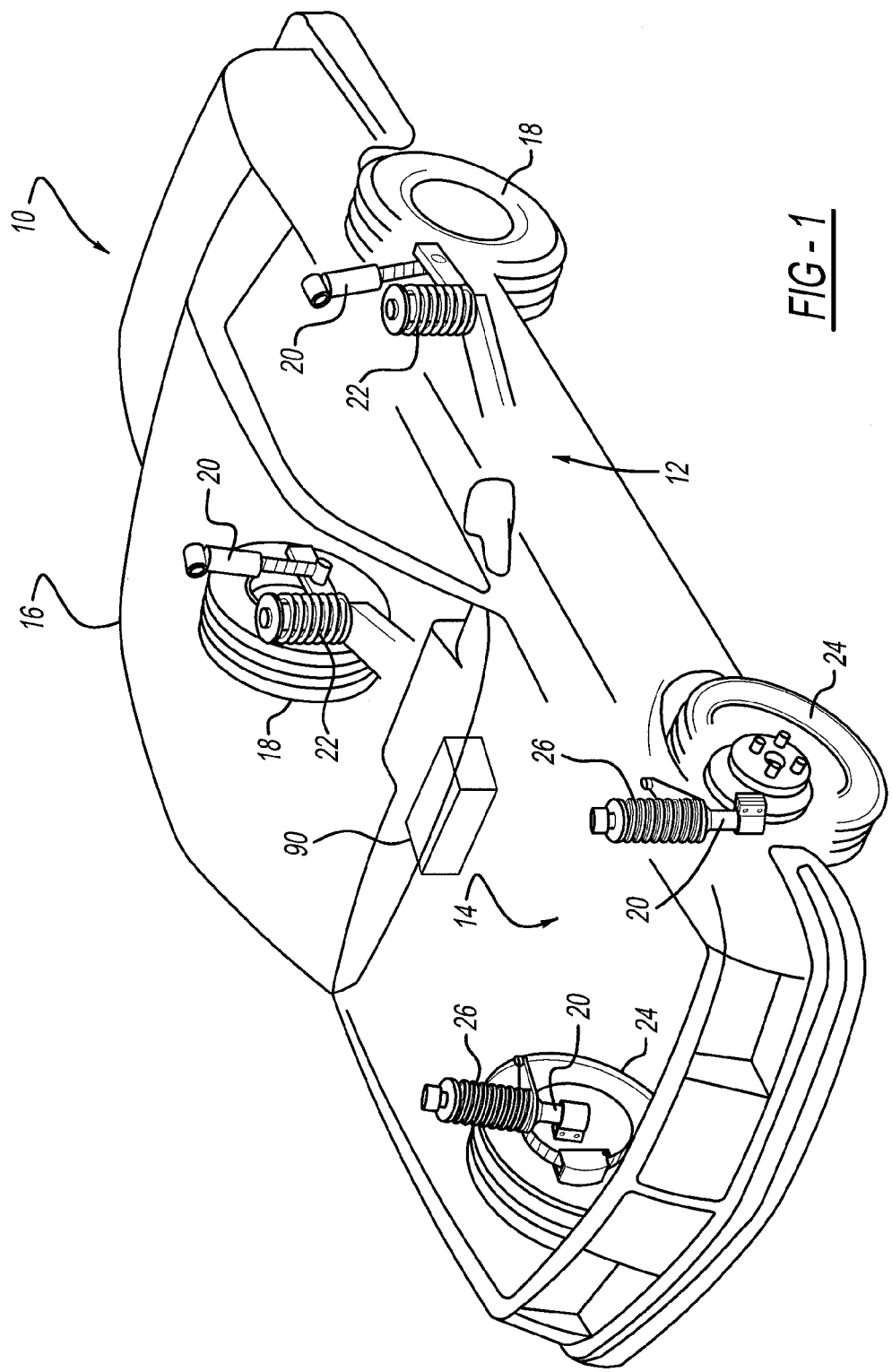
FIG. 1 is an illustration of a vehicle having a damper system which incorporates an electrically adjustable hydraulic shock absorber and a damper module in accordance with the present disclosure.

The present disclosure will now be described more fully with reference to the accompanying drawings. With reference to FIG. 1, an example of a vehicle 10 incorporating a suspension system having dampers with an integrated electronic system is now presented. The vehicle 10 includes a rear suspension 12, a front suspension 14, and a body 16. The rear suspension 12 has a transversely extending rear axle assembly (not shown) adapted to operatively support a pair of rear wheels 18. The rear axle assembly is attached to the body 16 by means of a pair of damper systems 20 and by a pair of springs 22. Similarly, the front suspension 14 includes a transversely extending front axle assembly (not shown) to operatively support a pair of front wheels 24. The front axle assembly is attached to the body 16 by means of a pair of the damper systems 20 and by a pair of springs 26.

The damper systems 20 serve to dampen the relative motion of the unsprung portion (i.e., front and rear suspensions 12, 14) with respect to the sprung portion (i.e., body 16) of vehicle 10. While the vehicle 10 has been depicted as a passenger car having front and rear axle assemblies, the damper system 20 may be used with other types of vehicles or in other types of applications including, but not limited to, vehicles incorporating non-independent front and/or non-independent rear suspensions, vehicles incorporating independent front and/or independent rear suspensions or other suspension systems known in the art. In addition, the damper system 20 may also be used on all wheeled and/or tracked vehicles. For example the damper system 20 may be used on two and/or three wheels type of vehicles, such as motorcycles and all-terrain vehicles.

Referring now to FIGS. 2-3, an example of the damper system 20 is shown in greater detail. The damper system 20 includes an electrically adjustable hydraulic shock absorber 30 ("shock absorber 30" hereinafter) and a damper module (DM) 32. As shown in FIG. 3, the shock absorber 30 may have a twin tube configuration. The shock absorber 30 may include a pressure tube 36, a piston assembly 38, a piston rod 39, a reserve tube 40 and a base valve assembly 42.

In the example embodiment described herein, the damper system 20 is described and depicted as including a twin tube electrically adjustable shock absorber. It is readily understood that the damper system 20 may include other types of electrically adjustable hydraulic shock absorber and is not limited to the shock absorber described herein. For example, the damper system 20 may include an electrically, adjustable shock absorber having a mono-tube configuration, a triple-tube configuration, or any other suitable shock absorber design known in the art. Furthermore, in the following description, the shock absorber is connected to the sprung and unsprung portions of the vehicle as a non-inverted shock absorber. It is readily understood that the present disclosure is further applicable to inverted shock absorbers, which differ in the manner in which it is connected to the sprung and unsprung portions of vehicle.

The pressure tube 36 defines a working chamber 44. The piston assembly 38 is slidably disposed within the pressure tube 36 and divides the working chamber 44 into an upper working chamber 46 and a lower working chamber 48.

The piston rod 39 is attached to the piston assembly 38 and extends through the upper working chamber 46 and through a rod guide assembly 50 which closes the upper end of the pressure tube 36. The end of the piston rod 39 opposite to the piston assembly 38 is adapted to be secured to the sprung mass of the vehicle 10.

Valving within the piston assembly 38 controls the movement of fluid between the upper working chamber 46 and the lower working chamber 48 during movement of the piston assembly 38 within the pressure tube 36. Since the piston rod 39 extends through the upper working chamber 46 and not the lower working chamber 48, movement of the piston assembly 38 with respect to the pressure tube 36 causes a difference in the amount of fluid displaced in the upper working chamber 46 and the amount of fluid displaced in the lower working chamber 48. The fluid displaced may flow through the base valve assembly 42, the piston assembly 38, or a combination thereof.

The reserve tube 40 surrounds the pressure tube 36 to define a fluid reservoir chamber 52 located between tubes 40 and 36. The bottom end of the reserve tube 40 is closed by a base cup 54 which can be connected to the unsprung mass of vehicle 10. The upper end of reserve tube 40 is attached to the rod guide assembly 50. The base valve assembly 42 is disposed between the lower working chamber 48 and the reservoir chamber 52 to control the flow of fluid between chambers 48 and 52. When the shock absorber 30 extends in length, an additional volume of fluid is needed in the lower working chamber 48. Thus, fluid may flow from the reservoir chamber 52 to the lower working chamber 48 through, for example, the base valve assembly 42. When the shock absorber 30 compresses in length, an excess of fluid must be removed from the lower working chamber 48, and therefore, fluid may flow from the lower working chamber 48 to the reservoir chamber 52 through the base valve assembly 42, the piston assembly 38, or a combination thereof.

The shock absorber 30 may include one or more electromechanical valves 34. The electromechanical valve 34 may be a digital valve, a variable state valve, or other suitable electromechanical valves. The electromechanical valve 34 may include a coil that controls the actuation of the electromechanical valve 34. More particularly, when power is supplied to the electromechanical valve 34, the coil creates a magnet field that actuates the electromechanical valve 34. The actuation of the electromechanical valve 34 controls the flow of fluid within the shock absorber 30. For example, the electromechanical valve 34 may control the flow of fluid between the upper working chamber 46 and the reservoir chamber 52.

While in the example embodiment the electrically adjustable hydraulic shock absorber is provided as having an electromechanical valve 34, the present disclosure is also applicable to electrically adjustable hydraulic shock absorbers that do not require an electromechanical valve. For example, the present disclosure is applicable to an electrically adjustable hydraulic shock absorber that uses magneto-rheological and electro-rheological damping technologies.

Figure 4:
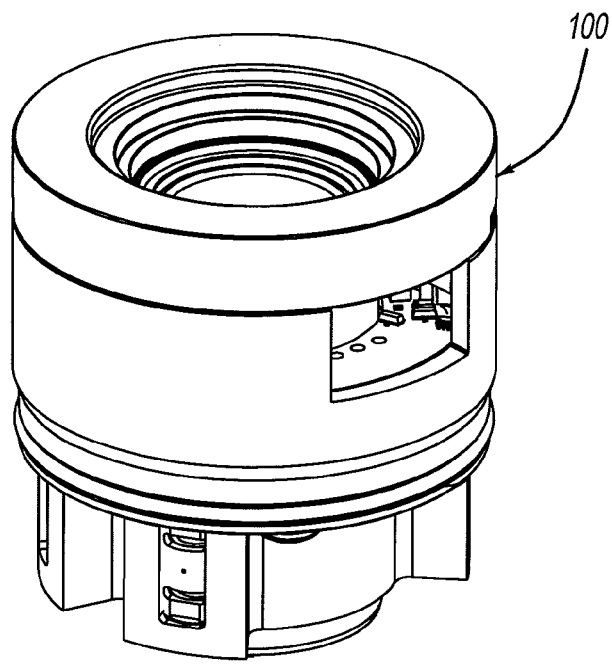
FIG. 4 is an enlarged perspective view of a housing which houses an integrated electronic system.
Figure 5:
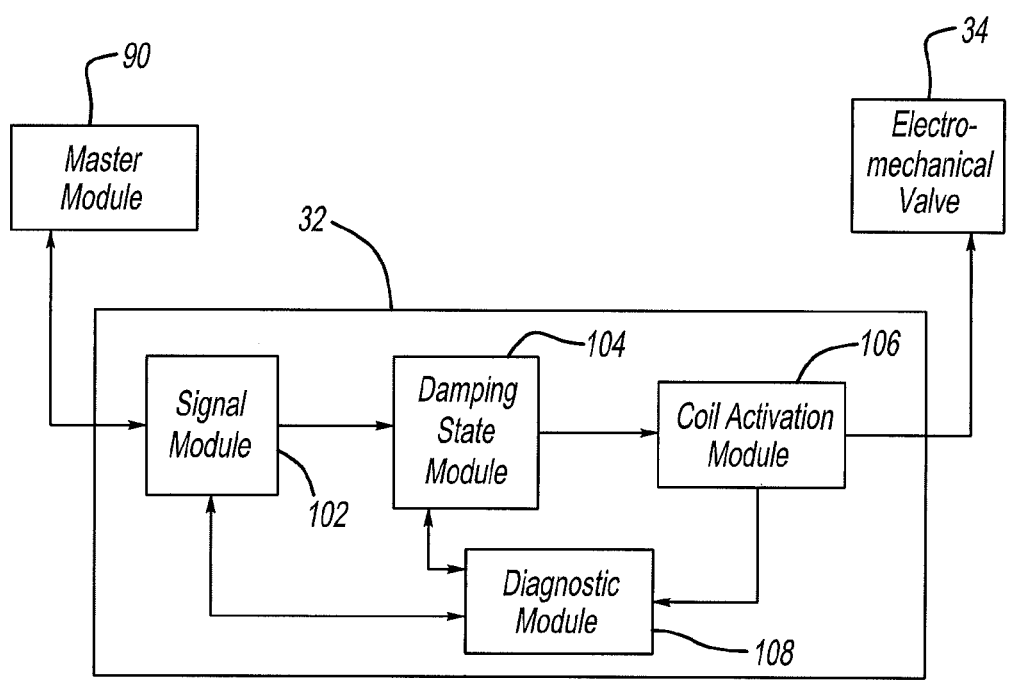
FIG. 5 is an example functional block diagram of the damper module.

With reference to FIGS. 4-5, an example of the DM 32 is presented. The DM 32 is disposed at the shock absorber 30 in a housing 100. The DM 32 controls the damping characteristics of the shock absorber. For example, in the example embodiment, the DM 32 may control the damping characteristics of the shock absorber 30 by controlling the actuation of the electromechanical valve 34 disposed within the shock absorber 30. Accordingly, each damper system 20 includes a DM that controls the operation of the shock absorber 30, as described in further detail below.

The DM 32 may receive a damper setting from a master module 90 disposed in the vehicle 10. More particularly, the DM 32 is communicably coupled to the master module 90 via a communication network. The master module 90 transmits data as an electronic signal via the communication network. The electronic signal may be an analog signal, a pulse width modulated (PWM) signal, CAN, LIN, or other type of signal/digital signal protocol known in the art. Based on the damper setting, the DM 32 controls the electromechanical valve(s) 34 disposed within the shock absorber 30, such that the shock absorber 30 operates at a target damping state.

With reference to FIG. 5, an example of the DM 32 is now presented. The DM 32 includes a signal module 102, a damping state module 104, a coil activation module 106, and a diagnostic module 108. The signal module 102 decodes the electronic signal received from a device external of the DM 32, such as the master module 90. For example, the signal module 102 receives the damper setting from the master module 90. The signal module 102 may also transmit data to the device external of the DM 32. For example, the signal module 102 may transmit data regarding a fault detected by the diagnostic module 108. It is readily understood that the signal module 102 may receive an electronic signal from other devices external of the DM 32, such as a switch, and is not limited to the master module 90.

The damping state module 104 determines a control operation for operating the shock absorber 30 at the target damping state based on the data received from the signal module 102. For example, based on the damper setting, the damping state module 104 determines a damping state of the shock absorber 30 and then controls actuation of the electromechanical valve 34 to operate the shock absorber 30 at the damping state determined. Similarly, if multiple electromechanical valves are disposed within the shock absorber 30, the damping state module 104 determines the appropriate activation/deactivation of each of the valves 34.

The damping state module 104 provides a control signal to the coil activation module 106 which in return controls the electrical power provided to a coil of the electromechanical valve 34. More particularly, the coil activation module 106 determines the inputs for a coil drive, as discussed below.

The diagnostic module 108 monitors the operation of the coil activation module 106 and the electromechanical valve 34 for any faults/failures. If a fault is detected the diagnostic module 108 may notify the damping state module 104. The damping state module 104 may then control the shock absorber 30 to a predetermined operation state.

As provided above, information regarding the fault may also be transmitted to a device external of the DM 32. For example, the diagnostic module 108 may transmit data regarding the fault to the signal module 102 which transmits the data to the master module 90.

In operation, the DM 32 controls the damping state of the electrically adjustable hydraulic shock absorber 30. The DM 32 is disposed within the housing 100 as an integrated electronic system. Specifically, as shown in FIGS. 6-7, the shock absorber 30 includes a printed circuit board assembly (PCBA) 200. The PCBA 200 is disposed at the shock absorber 30, and can be disposed within the housing 100. In the example embodiment the PCBA 200 is disposed within the rod guide assembly 50. The PCBA 200 is an integrated electronic system that electrically powers coil(s) via coil drivers to create a magnetic field. The magnetic field actuates the electromechanical valve 34 (i.e., a hydraulic valve), thereby adjusting the damping characteristic of the shock absorber 30.

Figure 8:
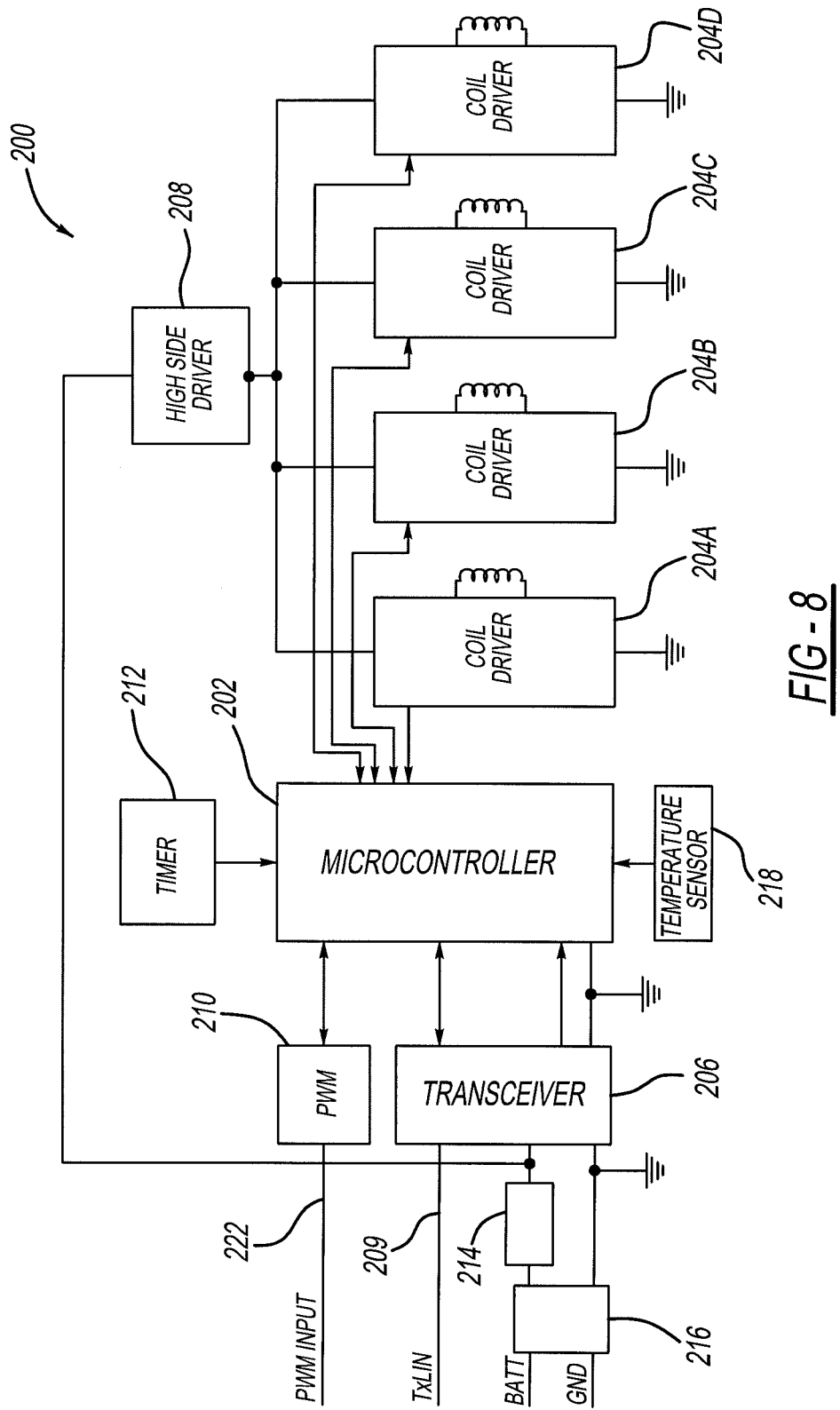
FIG. 8 is an example block diagram of the PCBA.

With reference to FIG. 8, an example block diagram of the PCBA 200 is shown. It is readily understood that the PCBA 200 may include other components, and is therefore not limited to the components and/or configuration depicted. The PCBA 200 includes a microcontroller 202, coil drivers 204A, 204B, 204C, and 204D (hereinafter "coil drivers 204A-204D"), and a transceiver 206. The microcontroller 202 performs the functions of the DM 32. Specifically, microcontroller 202 performs the operation of the signal module 102, the damping state module 104, the coil activation module 106, and the diagnostic module 108.

As the coil activation module 106, the microcontroller 202 determines an input for each of the coil drivers 204A-204D. As power drive electronics, the coil drivers 204A-204D control current to, for example, the electromechanical valves based on the input (i.e., signal) from the microcontroller 202. While in the example embodiment four coil drivers are shown, it is readily understood that one or more coil drivers may be used based on the number of electromechanical valves/coils disposed within the shock absorber 30. Specifically, each electromechanical valve has a dedicated coil driver.

As the diagnostic module 108, the microcontroller 202 may monitor the electrical current powering each electromechanical valve 34 as it responds to a command to change the damper setting. Accordingly, the microcontroller 202 can monitor the electrical current levels to insure that the electrical components, such as the coil drivers 204A-204D and electromechanical valve coils, are working properly. Comparing the electrical current level to predetermined limits ensures coil drivers 204A-204D (i.e., the power drive electronics) are not experiencing a fault such as a short circuit, open circuit, temperature extreme, or other fault.

Additionally, with additional logic, the transient current profile, when recorded over time, can indicate the mechanical state of the electromechanical valve. As the electromechanical valve moves from the energized state to the unenergized state and vice versa, changes in the inductance of the electromechanical valve affect the electrical current. Inspection of this electrical current profile can, thus, determine the mechanical state of the electromechanical valve 34 as well as the electrical state.

The transceiver 206 may be provided as a LIN transceiver, CAN Bus, or Communication Bus. The transceiver communicably couples the PCBA 200 to the communication bus provided as the communication link between the DM 32 and devices external of the DM 32, such as the master module 90. The communication bus may be a LIN bus 209 which is external of the PCBA 200.

The PCBA 200 may also include a high side driver 208, a PWM input 210, a timer 212, a voltage regulator 214, a protection circuit 216, and a temperature sensor 218. The high side driver 208 is electrically coupled to each of the coil drivers 204A-204D. The high side driver 208 acts like a master switch for controlling the power supply to each of the coil drivers 204A-204D. The PWM input 210 may be provided as an alternative communication link (reference number 222 in FIG. 8) for receiving an electronic signal from sensors/modules disposed external of the PCBA 200. The timer 212 may be a watchdog timer that monitors the operation of the microcontroller 202 and resets the microcontroller 202 if needed.

The temperature sensor 218 detects the ambient temperature of the PCBA 200. The temperature sensor 218 provides the information to the microcontroller 202. The microcontroller 202 may then determine the proper operation of the damper system 20 based on the temperature detected. Accordingly, the components disposed on the PCBA 200 are protected from extreme temperatures.

The PCBA 200 receives power from a vehicle battery. The voltage regulator 214 conditions the electrical power from the vehicle battery to a voltage level suitable for the components on the PCBA 200. The protection circuit 216 may be provided as a battery line load dump transient and reverse voltage protection circuit. The protection circuit protects the components of the PCBA 200 from electrical transients which could damage or disrupt proper operation of the components on the PCBA 200.

The PCBA 200 may couple to the power supply and the communication bus via a connector 201 (FIG. 2). The connector 201 may be configured to both electrically and communicably couple the PCBA 200 to the power supply and the communication bus, respectively. Alternatively, the PCBA 200 may be coupled via two separate connectors. One for coupling to the power supply and the other to couple to the communication bus.

With reference to FIGS. 9-13, example methods of integrating the PCBA 200 with the shock absorber 30 are presented. It is readily understood that the present disclosure is not limited to the configuration shown in FIGS. 9-13, and that other suitable configurations may be employed for integrating the PCBA 200 with the shock absorber 30.

With reference to FIG. 9, an internal annular arrangement 300 is presented. In such an arrangement, the PCBA 200 is disposed within the rod guide assembly 50. Specifically, the PCBA 200 has a ring-like structure, such that the piston rod 39 (not shown) may extend through the PCBA 200. The annular arrangement is also represented in FIGS. 6 and 7. In such a configuration, the PCBA 200 is directly coupled to the electromagnetic valve 34. Specifically, the coil driver 204 disposed on the PCBA 200 is directly connected to the electromagnetic valve 34, thereby eliminating the need of an electrical connector.

With reference to FIG. 10, an internal vertical arrangement 320 is presented. The PCBA 200 is arranged vertically (i.e., parallel with the piston rod 39) and within the rod guide assembly 50. By arranging the PCBA 200 along a side surface of the rod guide assembly 50, the PCBA 200 is no longer limited to the annular shape. Specifically, the PCBA 200 may have a rectangular or square-like shape. A lead frame 250 provides an electrical connection between the coil drivers 204 disposed on the PCBA 200 and the electromagnetic valve 34. Therefore, the PCBA 200 is connected to the electromagnetic valve 34 by way of the lead frame 250.

With reference to FIG. 11, an inverted-wet arrangement 340 is presented. The PCBA 200 is arranged between the pressure tube 36 and the reserve tube 40. Specifically, in the twin tube type shock absorber, the PCBA 200 may be disposed in the reservoir chamber 52. Such a configuration is provided as "wet" since the PCBA 200 is in contact with hydraulic fluid. For purposes of clarity, the pressure tube 36 and the reserve tube 40 are not shown in FIG. 11. While not shown in the figure, it is readily understood that the PCBA 200 is disposed in a housing that prevents the hydraulic fluid from entering the PCBA 200.

The lead frame 250 couples the PCBA 200 to the electromechanical valve. For example, the lead frame 250 couples the coil driver 204 disposed on the PCBA 200 to an end of the electromagnetic valve 34 that is farthest from the rod guide assembly 50. Thus, the configuration has an inverted arrangement.

With reference to FIG. 12, an external arrangement 360 is presented. The PCBA 200 is arranged along an external surface of the shock absorber 30. The PCBA 200 can be disposed in a housing that protects the PCBA 200 from the environmental elements such as rain, humidity, debris, etc. The PCBA 200 is then coupled to the electromechanical valve 34 via a lead frame 254.

Figure 13:
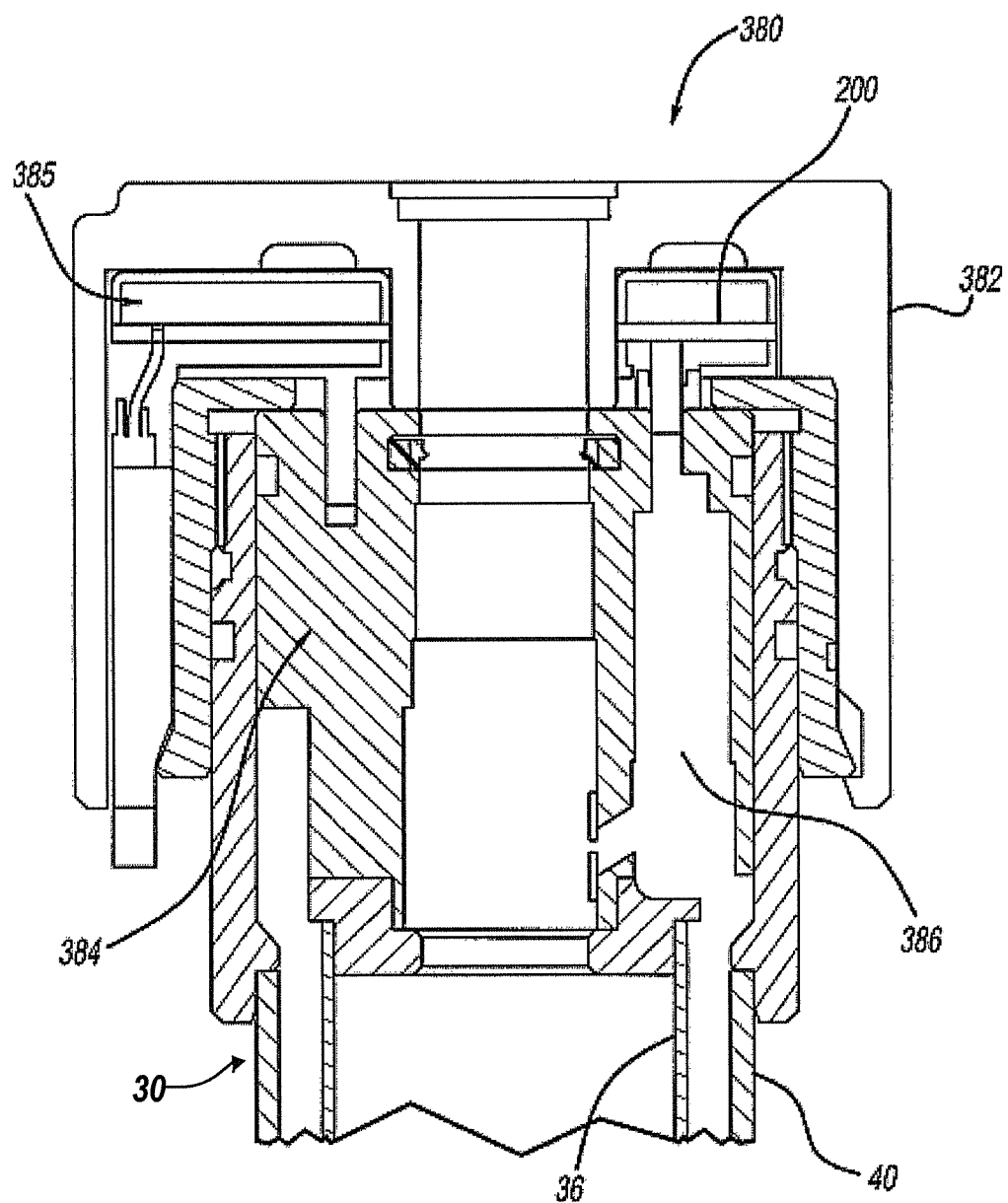
FIG. 13 illustrates a cap arrangement of the PCBA.

With reference to FIG. 13, a cap arrangement 380 is presented. The PCBA 200 is disposed within a cap 382. The cap 382 is positioned external to the shock absorber 30. More particularly, the cap 382 is attached to an end of the shock absorber 30. The PCBA 200 is disposed in a gap 385 defined between the cap 382 and the shock absorber 30. Specifically, the PCBA 200 can be disposed between the cap, the rod guide 384, and the reserve tube 40.

The cap 382 may or may not be a load bearing structure. Specifically the PCBA 200 has a ring like structure, such that the piston rod 39 (not shown) may extend through both the PCBA 200 and the cap 382. Furthermore, the PCBA 200 is electrically coupled to an electromechanical valve disposed within a valve cavity 386. Based on the distance between the PCBA 200 and the electromechanical valve, the PCBA 200 may be directly connected to the electromechanical valve or may be indirectly connected via, for example, a lead frame.

Figure 14:
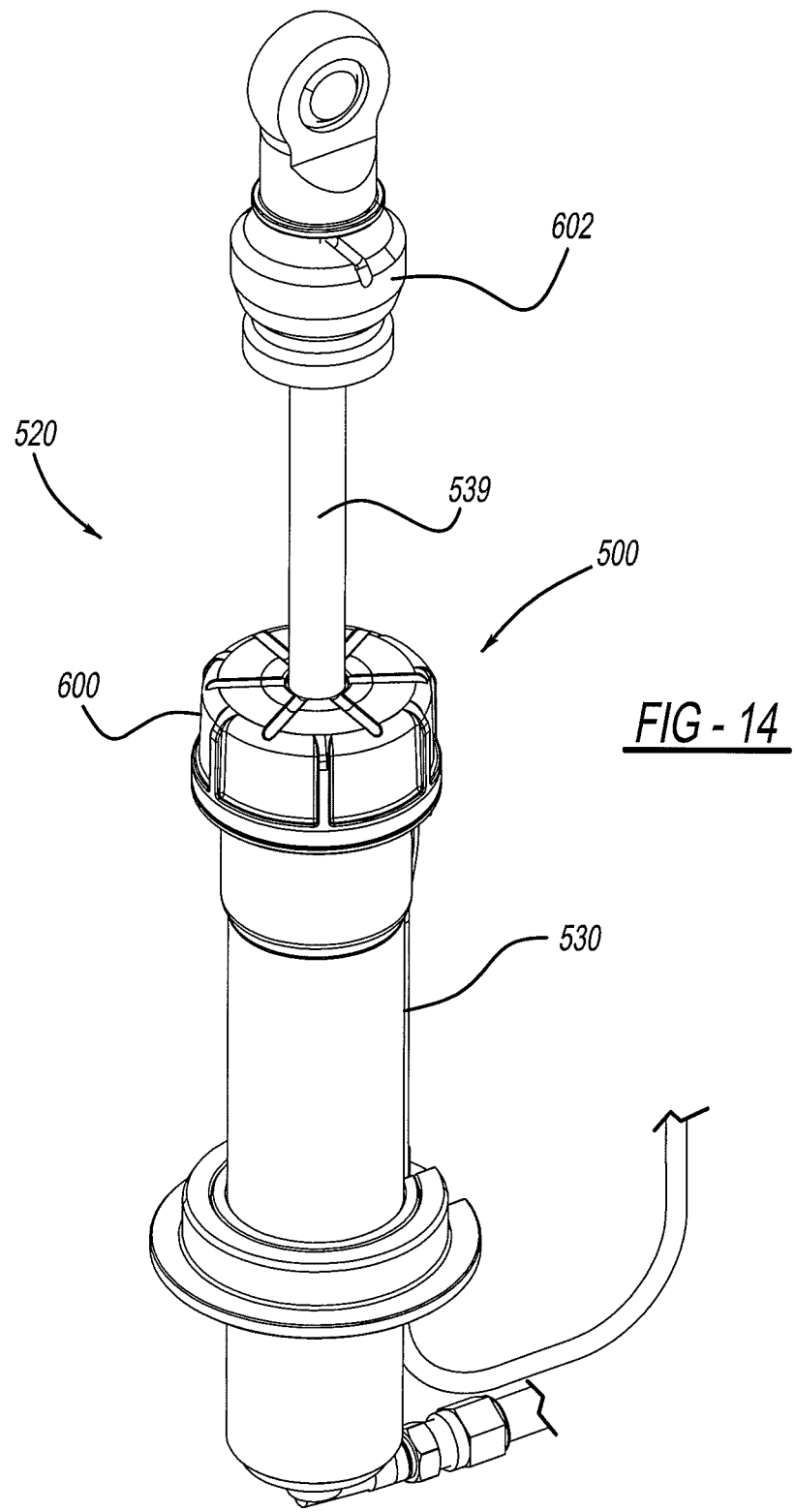
FIG. 14 illustrates a damper system having a bumper cap arrangement of the PCBA.

With reference to FIGS. 14-20, a bumper cap arrangement 500 is presented. The bumper cap arrangement 500 has a PCBA arranged within a gap defined by a bumper cap which is a load bearing structure. More particularly, FIG. 14 shows a damper system 520 having the bumper cap arrangement 500. The damper system 520 is substantially similar to the damper system 20. Accordingly, like numerals may be used to describe like features and components.

A bumper cap assembly 600 is attached to a shock absorber 530. The bumper cap assembly 600 is positioned between a rod guide assembly 550 of the shock absorber 530 and a jounce bumper 602. The jounce bumper 602 is a rubber or elastomeric component that is positioned on a piston rod 539.

Figures 15, 16:
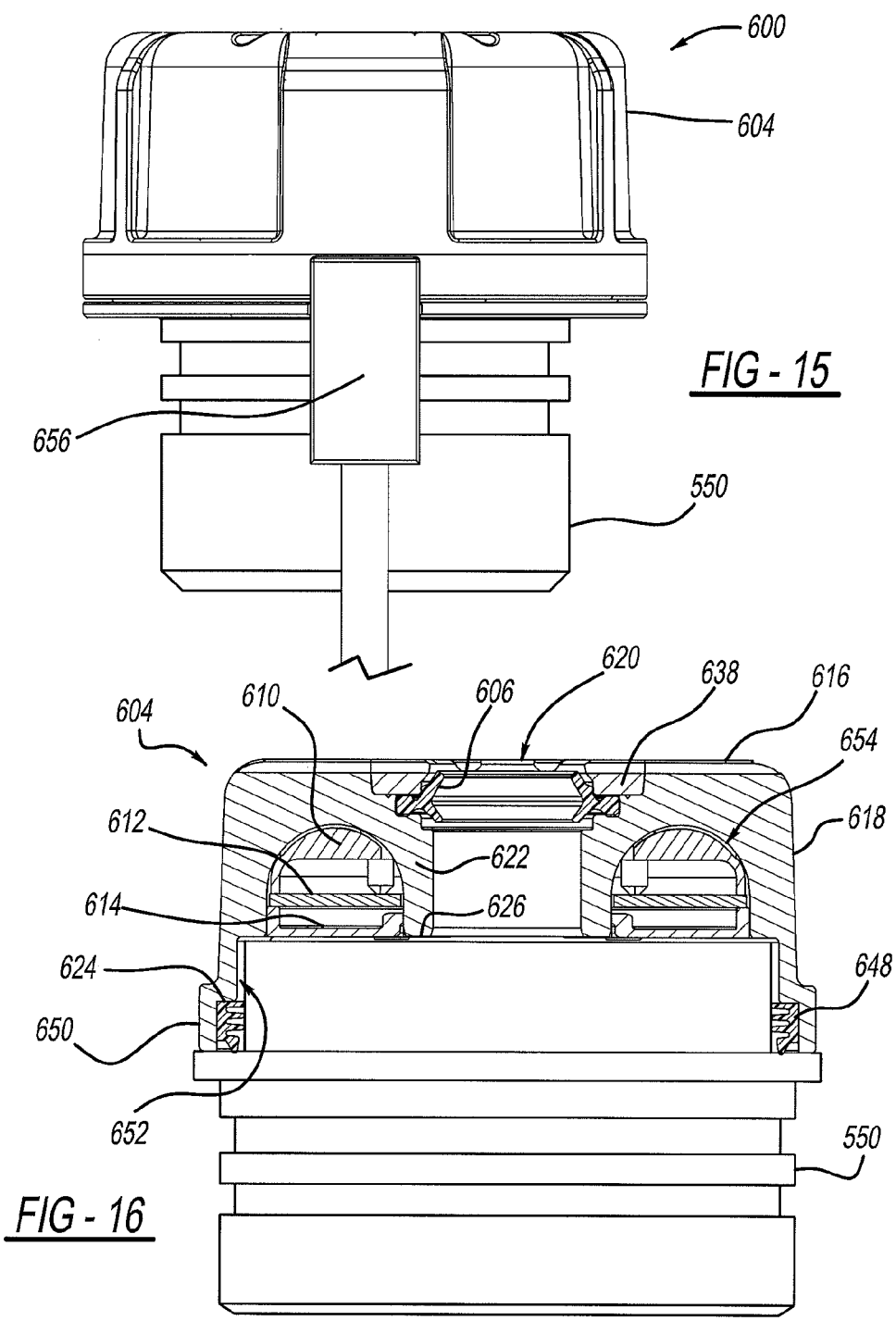
FIG. 15 is a perspective view of a bumper cap assembly of FIG. 14 disposed on a rod guide assembly of a shock absorber.
FIG. 16 is a partial cross-sectional view of FIG. 15.
Figure 19:
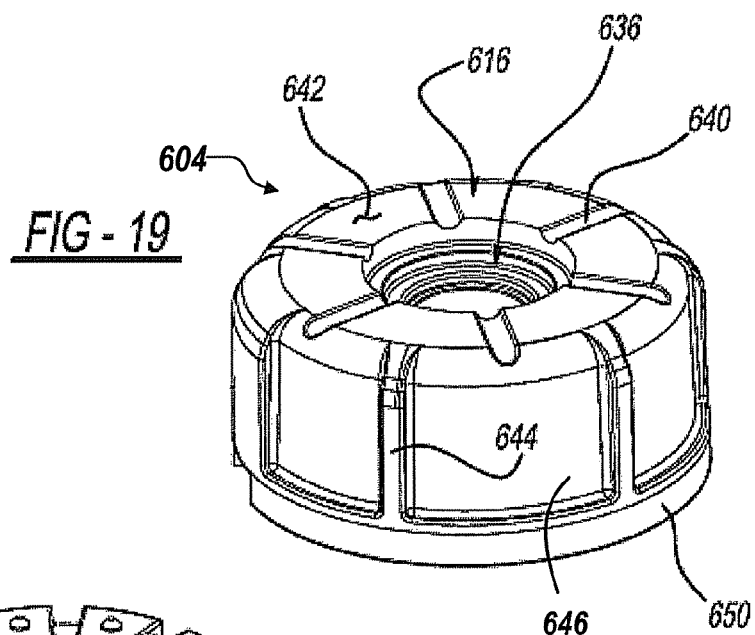

With reference to FIGS. 15-17, the bumper cap assembly 600 includes a bumper cap 604, a dirt wiper 606, and an electronic isolator assembly 608. The electronic isolator assembly 608 includes a gasket 610, a PCBA 612, and an isolator 614. The bumper cap 604 houses the electronic isolator assembly 608 (FIG. 16). The bumper cap 604 can be made of glass filed polyamide or polyphathlamide, and is a machined and/or molded component. The bumper cap 604 prevents metal to metal contact during severe jounce travel of the damping system 520.

The bumper cap 604 has an annular cover 616 and a cylindrical body 618. The annular cover 616 defines an aperture 620 for receiving the piston rod 539 of the shock absorber 530. A column 622 extends from the aperture 620.

The bumper cap 604 includes an outer shoulder 624, an inner shoulder 626, and multiple inner ribs 628. The outer shoulder 624 circumferentially extends from an inner surface 630 of the cylindrical body 618. The outer shoulder 624 abuts against the rod guide assembly 550.

The inner shoulder 626 is formed at the end of the column 622. In the assembled condition, a clearance gap is defined between the inner shoulder 626 and the rod guide assembly 550 of the shock absorber 530. During a jounce load, a compressive force is exerted onto the bumper cap 604. As a result, the inner shoulder 626 moves downward and abuts against the rod guide assembly 550, thereby eliminating the clearance gap.

The inner ribs 628 radially extend from the column 622 to the inner surface 630 of the cylindrical body 618, and are disposed along an inner surface 632 of the annular cover 616. The inner ribs 628 provide a continuous transition between the inner shoulder 626 and the outer shoulder 624. The inner ribs 628, the inner shoulder 626 and the outer shoulder 624 control the deflection of the bumper cap 604, such that the bumper cap 604 does not collapse onto the electronic isolator assembly 608 disposed within. More particularly, the outer shoulder 624 maintains contact with the shock absorber 530 during loaded and unloaded operating conditions. The inner shoulder 626 contacts the shock absorber 530 during loaded operating conditions. The inner ribs 628 reinforce the cylindrical body 618 by distributing and absorbing compressive forces placed on the cylindrical body 618.

The bumper cap 604 also includes a snap member 634 formed along an upper inner surface 635 of the cylindrical body 618 (FIG. 18). The snap member 634 aligns with and couples to a groove (not shown) defined around an outer surface of the shock absorber 530. The groove and snap member 634 form a snap-in feature used to attach the bumper cap 604 to the shock absorber 530. The snap-in feature retains the bumper cap 604 on the shock absorber 530 during extreme thermal conditions. The bumper cap 604 may be detached from the shock absorber 530 by simply decoupling the snap member 634 from the groove. The bumper cap 604 can be attached to the shock absorber using various suitable fastening methods, and is not limited to the snap-in-feature.

The bumper cap 604 further defines a seal cavity 636 at the annular cover 616, and includes a retainer 638. The dirt wiper 606 is positioned within the seal cavity 636 and is retained by the retainer 638. The dirt wiper 606 prevents water and dirt from entering the bumper cap 604 by creating a seal between the piston rod 539 and the bumper cap 604. The retainer 638 is fixedly attached to the cylindrical body 618 by way of, for example, ultra-sonic welding, adhesives, and/or other locking methods. Alternatively, instead of a two piece configuration, the bumper cap 604 may be purely one piece design in which the dirt wiper 606 is pressed fit into the seal cavity. Such one piece configuration removes the need for a separate component, but may require secondary machining operations of the seal cavity.

The bumper cap 604 defines a plurality of grooves 640 along an outer surface 642 of the annular cover 616. The grooves 640 extend radially outward from the aperture 620. The grooves 640 remove water and dirt that has been blocked by the dirt wiper 606, thereby preventing the foreign debris from accumulating at the annular cover 616. The groove 640 also prevents air from being trapped between the jounce bumper 602 and the bumper cap 604 during deflection, thereby preventing noise or pressurization of the bumper cap interior.

The bumper cap 604 includes a plurality of outer ribs 644 protruding from an outer surface 646 of the cylindrical body 618. The outer ribs 644 extend along an axis parallel with a longitudinal axis of the cylindrical body 618. The outer ribs 644 reinforce the sides of the cylindrical body 618. More particularly, the thickness of the cylindrical body 618 between the outer ribs 644 is thinner than at the outer ribs 644. This allows the bumper cap 604 to stretch over the rod guide assembly 550, while the outer ribs 644 restrain the sides of the cylindrical body 618 from expanding when compressive forces are placed on the bumper cap 604.

A lower seal 648 is positioned at a brim 650 of the cylindrical body. The lower seal 648 is an environmental seal that prevents debris from entering the bumper cap assembly 600. The lower seal 648 interfaces with an outer surface of the rod guide assembly 550. In the example embodiment, the lower seal 648 is provided as a separate component that is arranged within an opening 652 defined by the brim 650. Alternatively, the bumper cap 604 may include multiple lips, as the lower seal. For example, the lips are molded circumferentially along the inner surface 630 of the cylindrical body 618 at the brim 650.

The bumper cap 604 receives the gasket 610, the PCBA 612, and the isolator 614 (i.e., the electronic isolator assembly 608) via the opening 652. The gasket 610, the PCBA 612, and the isolator 614 are disposed in a gap 654 defined by the annular cover 616, the column 622, and the cylindrical body 618. The gasket 610 holds and isolates the PCBA 612. Specifically, the gasket 610 interfaces with an outer portion of the PCBA 612 to hold down the PCBA 612 and maintain the position of the PCBA 612, such that the PCBA 612 does not move within the gap 654.

The PCBA 612 is substantially similar to the PCBA 200. The PCBA 612 includes a connector 656, which is substantially similar to connector 201, and multiple terminals 658. The terminals 658 extend into the rod guide assembly 550 to engage with solenoids (not shown) of the digital valves 34 disposed in the rod guide assembly. The PCBA 612 electrically powers the solenoids via coil drivers in order to actuate the electromagnetic valves 34 of the shock absorber 530.

The isolator 614 isolates the vibrations experienced by the PCBA 612, and also aligns the terminals 658 with the solenoids. Specifically, the isolator includes a port 660 for each of the terminals 658 of the PCBA 612. The ports 660 receive and maintain the position of the terminals 658. In the assembled condition, the ports 660 align with the terminals of the solenoids disposed in the rod guide assembly 550. The terminals 658 are configured to receive the terminals of the solenoids.

To properly align the components of the bumper cap assembly 600 with each other and with the shock absorber 530 various alignment features may be used. For example, the isolator 614 may include one or more tabs 662 that extend from an outer parameter of the isolator 614. The bumper cap 604 defines corresponding notches 664 which align with the tabs 662. The tabs 662 and the notches 664 also prevent the isolator 614 from moving within the gap 654.

The connector 656 also acts as an alignment feature. For example, the gasket 610 includes a lid 666 which aligns with and covers the connector 656. Isolator 614 includes a bracket 668 which aligns and engages with the connector 656. The bumper cap 604 defines a slot 670 which aligns with and receives the connector 656.

Figure 20:
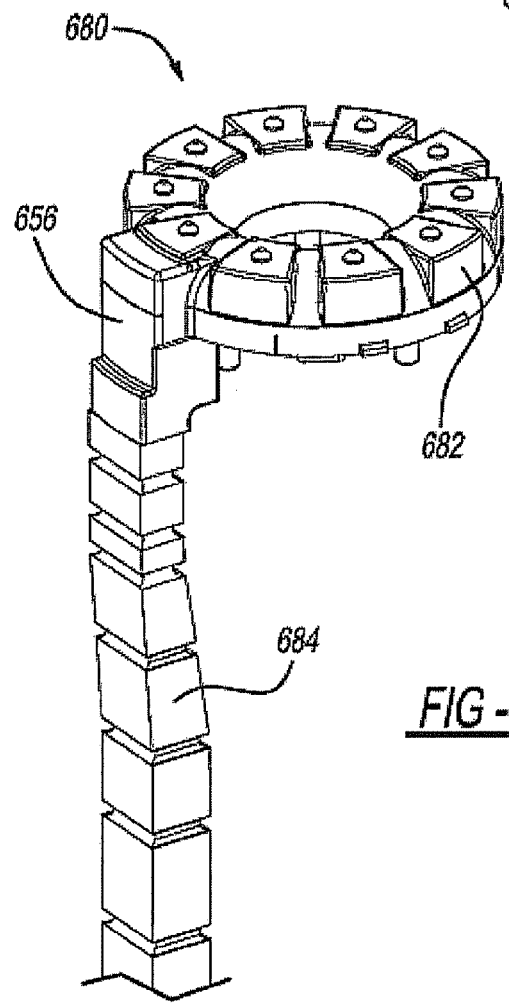
FIG. 20 is a perspective view of an integrated electronic assembly having a PCBA.

In the example embodiment, the electronic isolator assembly is provided as separate components which include the gasket 610, the PCBA 612, and the isolator 614. Alternatively, the gasket 610, the PCBA 612, and the isolator 614 may be encapsulated as a single component that is positioned in the bumper cap 604. For example, FIG. 20 shows an integrated electronic isolator assembly 680 ("integrated assembly", herein). The integrated assembly 680 includes a PCBA which is encapsulated within a body 682 and a cord 684 extending from the connector 656 to a device external of the shock absorber. The body 682 can be made of rubber or other suitable material. The body 682 performs like a gasket and an isolator to support and isolate the PCBA disposed within. The integrated assembly 680 simplifies assembly of the bumper cap assembly 600, and eliminates the need for various alignment features, such as the notches 664 and the tabs 662. Furthermore, the integrated assembly 680 protects the PCBA during assembly, and also provides additional structural support.

Figure 21:
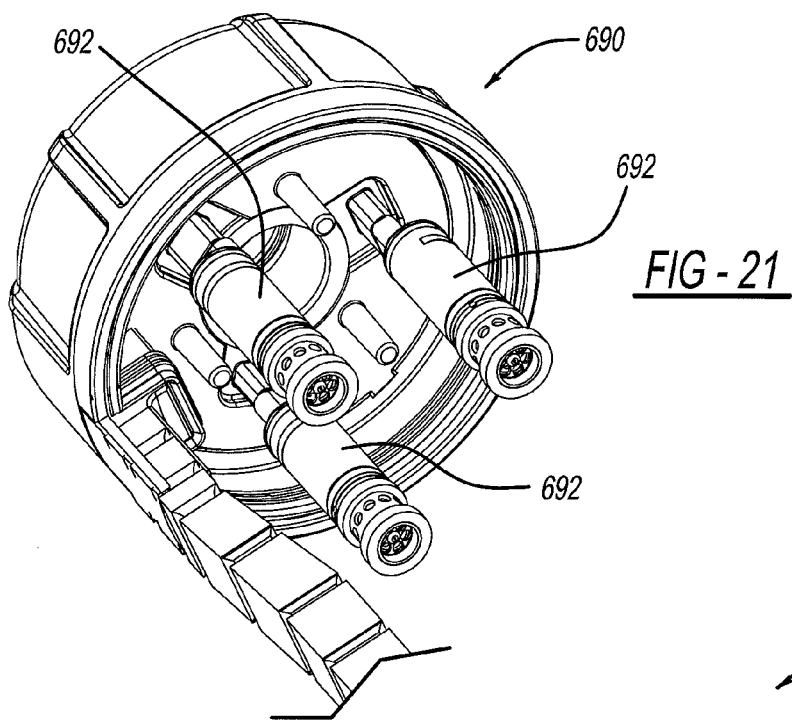
FIG. 21 is a perspective view of a bumper cap assembly having solenoids.
Figure 22:
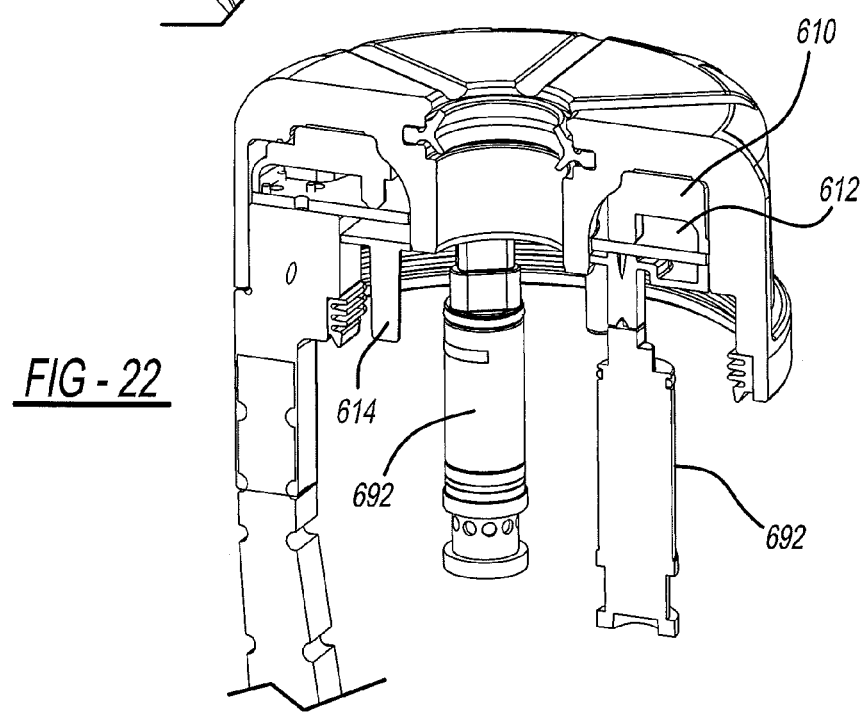
FIG. 22 is a cross-sectional view of the bumper cap assembly of FIG. 21.

In another variation, the solenoids originally positioned within the rod guide assembly, can be part of the bumper cap assembly. For example, FIGS. 21 and 22 to depict a bumper cap assembly 690 which includes solenoids 692. The solenoids 692 can be separate components that are attached to the terminals of the PCBA 612 via the isolator 614. The rod guide assembly is configured to receive the solenoids 692. Alternatively, the solenoids 692 can be part of the integrated assembly. Specifically, the solenoids are attached to the PCBA, and then the PCBA and solenoids are encapsulated within a body to form the integrated assembly.

The bumper cap arrangement 500 houses the PCBA within the bumper cap 604 which is load bearing structure. The bumper cap assembly 600 includes two seals (e.g., the dirt wiper 606 and the lower seal 648) which prevent debris and water from entering the bumper cap 604, thereby protecting the PCBA 612. The interior space of the bumper cap 604 is utilized to house the electronics of the damping system 520, thereby creating a single unit that can be assembled onto the shock absorber 530.

The bumper cap 604 is a rigid interface between the jounce bumper 602 and the body of the shock absorber and transfers loads to the body of the shock absorber during extreme jounce loads. For example, the walls of the cylindrical body provide structural support by alleviating bending stress placed on the column 622 and the inner ribs 628. The compressive load is evenly distributed between the cylindrical body 618 and the column 622 for optimum rigidity against loading. The outer ribs 644 provided along the outer wall of the cylindrical body 618 prevent geometric instability in the bumper cap 604 by restraining the lower portion of the cylindrical body 618 from expanding, thereby reducing strain and radial deflection of the brim 650 of the bumper cap 604 and maintaining engagement with the shock absorber.

As provided above, the present disclosure is also applicable to electrically adjustable hydraulic shock absorbers that do not include an electromagnetic valve. For example, if the shock absorber utilizes magneto-rheological and electro-rheological damping technologies, the damping module may operate the shock absorber using known methods that utilize the magneto-rheological and electro-rheological damping technologies. Accordingly, instead of the electromechanical valve, the PCBA controls the current supplied to a coil disposed within the shock absorber.

As provided above, the PCBA is an integrated electronic system that electrically powers coil(s) to create a magnetic field. The magnetic field actuates the electromechanical valve (i.e., a hydraulic valve), thereby adjusting the damping characteristic of the shock absorber. By integrating an electronics system with the electrically adjustable hydraulic shock absorber, the complexity of a vehicle damping system/suspension system is reduced. In essence, each damper system 20 includes its own power drive electronics for controlling the damping state of the shock absorber 30.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof.

When an element is referred to as being "on," "engaged to," "connected to," or "coupled to" another element, it may be directly on, engaged, connected or coupled to the other element, or intervening elements may be present. In contrast, when an element is referred to as being "directly on," "directly engaged to," "directly connected to," or "directly coupled to" another element, there may be no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements and/or components, these elements and/or components should not be limited by these terms. These terms may be only used to distinguish one element or component from another. Terms such as "first," "second," and other numerical terms when used herein do not imply a sequence or order unless clearly indicated by the context. Thus, a first element or component discussed could be termed a second element or component without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A bumper cap assembly for an electrically adjustable hydraulic shock absorber, the bumper cap assembly comprising:

an electronic isolator assembly including a printed circuit board assembly, a gasket, and an isolator, the printed circuit board assembly is arranged between the gasket and the isolator; and a bumper cap having a cylindrical body, an annular cover defining an aperture, and including an inner column extending inward from the aperture, wherein the cylindrical body, the annular cover, and the inner column define a gap, and the electronic isolator assembly is housed within the gap, wherein the bumper cap includes:

an outer shoulder that extends along an interior surface of the cylindrical body and abuts with an end of the shock absorber, and an inner shoulder that is formed at an end of the column, the inner shoulder abuts with the end of the shock absorber during a loaded state of the bumper cap and defines a clearance gap with the end of the shock absorber during an unloaded state of the bumper cap.

2. A bumper cap assembly for an electrically adjustable hydraulic shock absorber, the bumper cap assembly comprising:
an electronic isolator assembly including a printed circuit board assembly, a gasket, and an isolator, the printed circuit board assembly is arranged between the gasket and the isolator; and
a bumper cap having a cylindrical body, an annular cover defining an aperture, and including an inner column extending inward from the aperture, wherein the cylindrical body, the annular cover, and the inner column define a gap, and the electronic isolator assembly is housed within the gap, wherein the bumper cap includes a plurality of ribs that radially extend from the column to the cylindrical body along an inner surface of the annular cover.

3. The bumper cap assembly of claim 2 wherein the electronic isolator assembly is one piece that has the printed circuit board encapsulated in a body that forms the gasket and the isolator.

4. A bumper cap assembly for an electrically adjustable hydraulic shock absorber, the bumper cap assembly comprising:
an electronic isolator assembly including a printed circuit board assembly, a gasket, and an isolator, the printed circuit board assembly is arranged between the gasket and the isolator; and
a bumper cap having a cylindrical body, an annular cover defining an aperture, and including an inner column extending inward from the aperture, wherein the cylindrical body, the annular cover, and the inner column define a gap, and the electronic isolator assembly is housed within the gap, wherein the bumper cap defines a plurality of grooves that extend radially from the aperture along an outer surface of the annular cover.

5. A bumper cap assembly for an electrically adjustable hydraulic shock absorber, the bumper cap assembly comprising:
an electronic isolator assembly including a printed circuit board assembly, a gasket, and an isolator, the printed circuit board assembly is arranged between the gasket and the isolator; and
a bumper cap having a cylindrical body, an annular cover defining an aperture, and including an inner column extending inward from the aperture, wherein the cylindrical body, the annular cover, and the inner column define a gap, and the electronic isolator assembly is housed within the gap, wherein the bumper cap includes a plurality of ribs that extend longitudinally along an outer surface of the cylindrical body, such that a thickness of the cylindrical body between two adjacent ribs is less than a thickness of the cylindrical body at the rib.

6. A bumper cap assembly for an electrically adjustable hydraulic shock absorber, the bumper cap assembly comprising:
an electronic isolator assembly including a printed circuit board assembly, a gasket, and an isolator, the printed circuit board assembly is arranged between the gasket and the isolator; and
a bumper cap having a cylindrical body, an annular cover defining an aperture, and including an inner column extending inward from the aperture, wherein the cylindrical body, the annular cover, and the inner column define a gap, and the electronic isolator assembly is housed within the gap, wherein the bumper cap includes a rim that attaches to a groove defined around an outer surface of the shock absorber.

7. A bumper cap assembly for an electrically adjustable hydraulic shock absorber, the bumper cap assembly comprising:
an electronic isolator assembly including a printed circuit board assembly, a gasket, and an isolator, the printed circuit board assembly is arranged between the gasket and the isolator;
a bumper cap having a cylindrical body, an annular cover defining an aperture, and including an inner column extending inward from the aperture, wherein the cylindrical body, the annular cover, and the inner column define a gap, and the electronic isolator assembly is housed within the gap;
a dirt wiper concentrically disposed with the aperture, wherein the dirt wiper seals between a piston rod extending through the aperture; and
a seal disposed at an end of the cylindrical body opposite of the annular cover.

8. A damper system for a vehicle comprising:
an electrically adjustable hydraulic shock absorber; and
a bumper cap assembly coupled to an end of the shock absorber, and including an electronic isolator assembly and a bumper cap, wherein the electronic isolator assembly is electrically coupled to the shock absorber and is disposed between the shock absorber and the bumper cap, wherein the bumper cap includes:
a cylindrical body, an annular cover defining an aperture, and an inner column extending inward from the aperture,
an outer shoulder that extends along an inner surface of the cylindrical body and abuts with an end of the shock absorber, and
an inner shoulder that is formed at an end of the column, the inner shoulder abuts with the end of the shock absorber during a loaded state of the bumper cap and defines a clearance gap with the end of the shock absorber during an unloaded state of the bumper cap.

* * * * *